US 12,176,046 B2

(12) United States Patent
Lee et al.

(10) Patent No.: US 12,176,046 B2
(45) Date of Patent: Dec. 24, 2024

(54) OPERATION METHOD OF MEMORY DEVICE AND OPERATION METHOD OF MEMORY SYSTEM INCLUDING THE SAME

(71) Applicant: Samsung Electronics Co., Ltd., Suwon-si (KR)

(72) Inventors: Yohan Lee, Incheon (KR); Sang-Wan Nam, Hwaseong-Si (KR); Sang-Won Park, Seoul (KR); Jiho Cho, Suwon-si (KR); Eunhyang Park, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 261 days.

(21) Appl. No.: 17/955,858

(22) Filed: Sep. 29, 2022

(65) Prior Publication Data

US 2023/0154553 A1 May 18, 2023

(30) Foreign Application Priority Data

Nov. 16, 2021 (KR) .................. 10-2021-0157776
Jan. 6, 2022 (KR) .................. 10-2022-0002333

(51) Int. Cl.
*G11C 16/08* (2006.01)
*G11C 16/10* (2006.01)
*G11C 16/24* (2006.01)
*G11C 16/34* (2006.01)

(52) U.S. Cl.
CPC ........ *G11C 16/3459* (2013.01); *G11C 16/102* (2013.01); *G11C 16/24* (2013.01); *G11C 16/3404* (2013.01)

(58) Field of Classification Search
CPC ... G11C 16/3459; G11C 16/102; G11C 16/24; G11C 16/3404; G11C 16/3495; G11C 2211/5621; G11C 2211/5644; G11C 11/5635; G11C 16/08; G11C 16/3427; G11C 11/5628; G11C 16/0483; G11C 16/34

See application file for complete search history.

(56) References Cited

U.S. PATENT DOCUMENTS 8,751,888 B2 6/2014 Kamigaichi et al.
9,299,443 B1 3/2016 Dong et al.
9,396,807 B2 7/2016 Alhussien et al.
(Continued)

FOREIGN PATENT DOCUMENTS

WO 2008045805 A1 4/2008

*Primary Examiner* — Hien N Nguyen
(74) *Attorney, Agent, or Firm* — Muir Patent Law, PLLC

(57) ABSTRACT

Disclosed is an operation method of a memory device that includes a plurality of memory cells stacked in a direction perpendicular to a substrate. The method includes performing first to (n−1)-th program loops on selected memory cells connected to a selected word line from among the plurality of memory cells, based on a first program parameter, and after the (n−1)-th program loop is performed, performing n-th to k-th program loops on the selected memory cells, based on a second program parameter different from the first program parameter. Herein, n is an integer greater than 1 and k is an integer greater than or equal to n. The first and second program parameters include information about at least two of a program voltage increment, a 2-step verify range, and a bit line forcing voltage used in the first to k-th program loops.

20 Claims, 23 Drawing Sheets

(56) References Cited

U.S. PATENT DOCUMENTS

| | | | |
|---|---|---|---|
| 9,514,823 B2 | 12/2016 | Melik-Martirosian | |
| 9,576,647 B2 | 2/2017 | Wong | |
| 9,899,097 B2 | 2/2018 | Kim et al. | |
| 2011/0220987 A1* | 9/2011 | Tanaka | H10B 43/50 |
| | | | 257/E21.409 |
| 2014/0301145 A1 | 10/2014 | Sakui | |
| 2015/0146489 A1* | 5/2015 | Lee | H10B 43/27 |
| | | | 365/185.29 |
| 2016/0049201 A1* | 2/2016 | Lue | G11C 16/16 |
| | | | 365/185.11 |
| 2016/0099068 A1* | 4/2016 | Kwak | G11C 16/14 |
| | | | 365/185.25 |
| 2019/0156904 A1* | 5/2019 | Hong | G11C 16/10 |
| 2020/0202938 A1 | 6/2020 | Reina | |
| 2020/0388312 A1* | 12/2020 | Park | G11C 16/10 |
| 2021/0125673 A1 | 4/2021 | Tachi et al. | |
| 2023/0154553 A1* | 5/2023 | Lee | G11C 16/24 |
| | | | 365/185.22 |

\* cited by examiner

|  | 1st PGM Parameter | 2nd PGM Parameter |
|---|---|---|
| Normal PGM | △Vpgm1<br>VFC1<br>RG_FC1 | △Vpgm2<br>VFC2<br>RG_FC2 |
| Resumed PGM | △Vpgm3<br>VFC3<br>RG_FC3 | △Vpgm4<br>VFC4<br>RG_FC4 |

OPERATION METHOD OF MEMORY DEVICE AND OPERATION METHOD OF MEMORY SYSTEM INCLUDING THE SAME

CROSS-REFERENCE TO RELATED APPLICATIONS

This application claims priority under 35 U.S.C. § 119 to Korean Patent Application No. 10-2021-0157776 filed on Nov. 16, 2021, and 10-2022-0002333 filed on Jan. 6, 2022, in the Korean Intellectual Property Office, the disclosures of which are incorporated by reference herein in their entireties.

BACKGROUND

Embodiments of the present disclosure described herein relate to a semiconductor memory, and more particularly, relate to an operation method of a memory device and an operation method of a memory system including the memory device.

A semiconductor memory device may be classified as a volatile memory device, in which stored data disappear when a power supply is turned off, such as a static random access memory (SRAM) or a dynamic random access memory (DRAM), or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

The flash memory device stores data by controlling threshold voltages of memory cells. The threshold voltages of the memory cells may be unintentionally changed due to various factors (e.g., interference, environmental conditions, etc.). In this case, an error occurs in data stored in the memory cells.

SUMMARY

Embodiments of the present disclosure provide an operation method of a memory device with improved reliability and an operation method of a memory system including the same.

According to an embodiment, an operation method of a memory device that includes a plurality of memory cells stacked in a direction perpendicular to a substrate may include performing first to (n−1)-th program loops on selected memory cells connected to a selected word line from among the plurality of memory cells, based on a first program parameter, and after the (n−1)-th program loop is performed, performing n-th to k-th program loops on the selected memory cells, based on a second program parameter different from the first program parameter, in which n may be an integer greater than 1 and k may be an integer greater than or equal to n. The first and second program parameters may include information about at least two of a program voltage increment, a 2-step verify range, and a bit line forcing voltage used in the first to k-th program loops.

According to an embodiment, a program method of a memory device that includes a plurality of memory cells stacked in a direction perpendicular to a substrate may include performing a first program step on selected memory cells connected to a selected word line from among the plurality of memory cells by applying a first program voltage to the selected word line, performing a first verify step on the selected memory cells by applying a first verify voltage set to the selected word line, performing a second program step on the selected memory cells by applying a second program voltage to the selected word line and applying a program-inhibit voltage, a ground voltage, and a first bit line forcing voltage to bit lines corresponding to the selected memory cells, based on a result of the first verify step, performing a second verify step on the selected memory cells by applying a second verify voltage set to the selected word line, and performing a third program step on the selected memory cells by applying a third program voltage to the selected word line and applying the program-inhibit voltage, the ground voltage, and a second bit line forcing voltage to the bit lines corresponding to the selected memory cells, based on a result of the second verify step. A difference between the first and second program voltages may be a first program voltage increment, a difference between the second and third program voltages may be a second program voltage increment different from the first program voltage increment, and the first bit line forcing voltage may be different from the second bit line forcing voltage.

According to an embodiment, an operation method of a memory system which includes a memory device and a memory controller configured to control the memory device may include sending, by the memory controller, a program command to the memory device, and performing, by the memory device, a program operation in response to the program command. The program operation may include performing first to (n−1)-th program loops on selected memory cells connected to a selected word line from among a plurality of memory cells included in the memory device, based on a first program parameter, and after the (n−1)-th program loop is performed, performing n-th to k-th program loops on the selected memory cells, based on a second program parameter different from the first program parameter, in which n may be an integer greater than 1 and k may be an integer greater than or equal to n. The first and second program parameters may include information about at least two of a program voltage increment, a 2-step verify range, and a bit line forcing voltage used in the first to k-th program loops.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that one of ordinary skill in the art may implement the invention.

Figure 1:
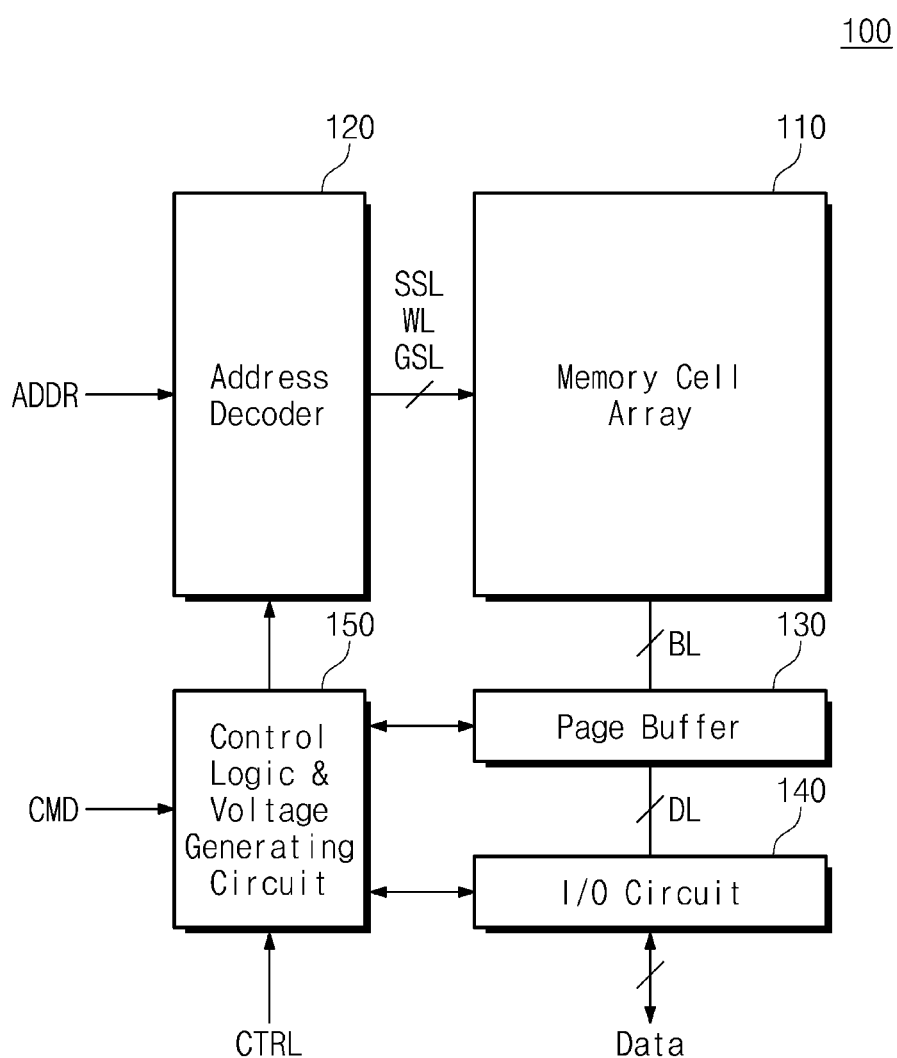
FIG. 1 is a block diagram illustrating a memory device according to an embodiment of the present disclosure.

FIG. 1 is a block diagram illustrating a memory device according to an embodiment of the present disclosure. Referring to FIG. 1, a memory device 100 may include a memory cell array 110, an address decoder 120, a page buffer circuit 130, an input/output circuit 140, and a control logic and voltage generating circuit 150. In an embodiment, the memory device 100 may be a nonvolatile memory device that includes NAND flash memory cells.

The memory cell array 110 may include a plurality of memory blocks. Each of the plurality of memory blocks may include a plurality of cell strings, each of which includes a plurality of cell transistors. The plurality of cell transistors may be connected in series between a bit line BL and a common source line CSL (refer to FIG. 2) and may be connected to string selection lines SSL, word lines WL, and ground selection lines GSL. In an embodiment, some of the plurality of cell transistors may be connected to an erase control line ECL that may be used for an erase operation of each of the plurality of memory blocks. A structure of each of the plurality of memory blocks will be described in detail with reference to FIG. 2. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The address decoder 120 may be connected to the memory cell array 110 through the string selection lines SSL, the word lines WL, the ground selection lines GSL, and the erase control line ECL. The address decoder 120 may receive an address ADDR from an external device (e.g., a memory controller) and may decode the received address ADDR. The address decoder 120 may control the string selection lines SSL, the word lines WL, the ground selection lines GSL, and the erase control line ECL based on a decoding result.

The page buffer circuit 130 may be connected to the memory cell array 110 through bit lines BL. The page buffer circuit 130 may read data stored in the memory cell array 110 by sensing voltage changes of the bit lines BL. The page buffer circuit 130 may store data in the memory cell array 110 by controlling voltages of the bit lines BL.

The input/output circuit 140 may receive data "DATA" from the external device (e.g., a memory controller) and may provide the received data "DATA" to the page buffer circuit 130. The input/output circuit 140 may receive the data "DATA" from the page buffer circuit 130 and may provide the received data "DATA" to the external device.

The control logic and voltage generating circuit 150 may receive a command CMD or a control signal CTRL from the external device (e.g., a memory controller) and may control various components of the memory device 100 in response to the received signals.

The control logic and voltage generating circuit 150 may generate various operation voltages necessary for the memory device 100 to operate. For example, the control logic and voltage generating circuit 150 may generate various operation voltages such as a plurality of program voltages, a plurality of pass voltages, a plurality of verify voltages, a plurality of read voltages, a plurality of non-selection read voltages, a plurality of erase voltages, and a plurality of erase verify voltages. Various voltages to be described below may be generated by the control logic and voltage generating circuit 150.

Figure 2:
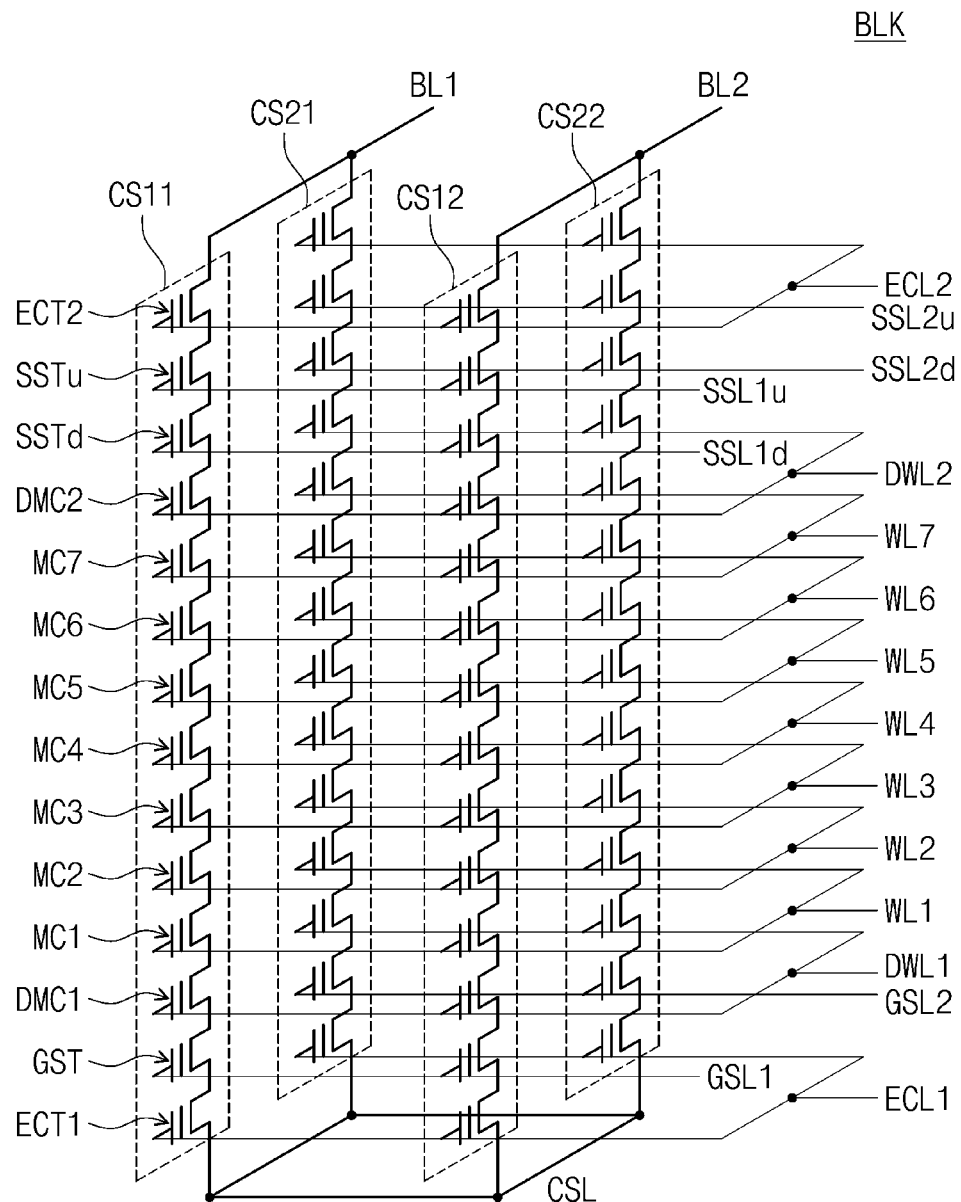
FIG. 2 is a circuit diagram illustrating one of a plurality of memory blocks included in a memory cell array in FIG. 1.

FIG. 2 is a circuit diagram illustrating one of a plurality of memory blocks included in a memory cell array in FIG. 1. A memory block of a three-dimensional structure will be described with reference to FIG. 2, but the present disclosure is not limited thereto. The memory block according to the present disclosure may have a two-dimensional memory block structure. One memory block BLK will be described with reference to FIG. 2, but the present disclosure is not limited thereto. The remaining memory blocks may be similar in structure to the memory block BLK to be described with reference to FIG. 2.

In an embodiment, the memory block BLK to be described with reference to FIG. 2 may correspond to a physical erase unit of the memory device 100. However, the present disclosure is not limited thereto. For example, the memory device 100 may perform the erase operation in units of page, word line, sub-block, or plane.

Referring to FIG. 2, the memory block BLK includes a plurality of cell strings CS11, CS12, CS21, and CS22. The plurality of cell strings CS11, CS12, CS21, and CS22 may be arranged in a row direction and a column direction to form rows and columns.

Each of the plurality of cell strings CS11, CS12, CS21, and CS22 includes a plurality of cell transistors. For example, each of the plurality of cell strings CS11, CS12, CS21, and CS22 may include string selection transistor SSTu and SSTd, a plurality of memory cells MC1 to MC7, a ground selection transistor GST, dummy memory cells DMC1 and DMC2, and erase control transistors ECT1 and ECT2. In an embodiment, each of the plurality of cell transistors included in the cell strings CS11, CS12, CS21, and CS22 may be a charge trap flash (CTF) memory cell.

In each cell string, the plurality of memory cells MC1 to MC7 are serially connected and are stacked in a height direction that is a direction perpendicular to a plane defined by the row direction and the column direction or to a substrate. In each cell string, the string selection transistors SSTu and SSTd are serially connected, and the serially connected string selection transistors SSTu and SSTd are provided between a bit line BL1 or BL2 and the plurality of memory cells MC1 to MC7. In each cell string, the ground selection transistor GST may be provided between the plurality of memory cells MC1 to MC7 and the common source line CSL.

In an embodiment, in each cell string, the first dummy memory cell DMC1 may be provided between the plurality of memory cells MC1 to MC7 and the ground selection transistor GST. In an embodiment, the second dummy memory cell DMC2 may be provided between the string selection transistors SSTu and SSTd and the plurality of memory cells MC1 to MC7.

In an embodiment, in each cell string, the first erase control transistor ECT1 may be provided between the ground selection transistor GST and the common source line CSL. In each cell string, the second erase control transistor ECT2 may be provided between the bit line BL1 or BL2 and the string selection transistors SSTu and SSTd. The erase control transistors ECT1 and ECT2 may be used to charge channels of the cell strings CS11, CS12, CS21, and CS22 with an erase voltage or to erase the memory block BLK, based on a gate induced drain leakage (GIDL) phenomenon.

The first erase control transistors ECT1 of the cell strings CS11, CS12, CS21, and CS22 may be connected in common with a first erase control line ECL1. However, the present disclosure is not limited thereto. For example, the first erase control transistors ECT1 of the cell strings CS11, CS12, CS21, and CS22 may be controlled with different erase control lines.

Ground selection transistors, which belong to the same row, from among the ground selection transistors GST placed at the same height may be connected to the same ground selection line, and ground selection transistors belonging to different rows may be connected to different ground selection lines. For example, the ground selection transistors GST of the cell strings CS11 and CS12 in the first row may be connected to a first ground selection line GSL1, and the ground selection transistors GST of the cell strings CS21 and CS22 in the second row may be connected to a second ground selection line GSL2. However, the present disclosure is not limited thereto. For example, ground selection transistors at the same height may be connected to the same ground selection line. Alternatively, ground selection transistors belonging to at least two rows from among ground selection transistors at the same height may be connected to the same ground selection line, and ground selection transistors belonging to at least two other rows from among ground selection transistors at the same height may be connected to another ground selection line Alternatively, ground selection transistors at different heights may be connected to the same ground selection line.

Memory cells of the same height from the substrate or the ground selection transistor GST may be connected in common with the same word line, and memory cells at different heights may be connected to different word lines. For example, the first to seventh memory cells MC1 to MC7 of the cell strings CS11, CS12, CS21, and CS22 may be connected to first to seventh word lines WL1 to WL7, respectively.

String selection transistors, which belong to the same row, from among the first string selection transistors SSTd at the same height are connected to the same string selection line, and string selection transistors belonging to different rows are connected to different string selection lines. For example, the first string selection transistors SSTd of the cell strings CS11 and CS12 in the first row may be connected in common with a string selection line SSL1d, and the first string selection transistors SSTd of the cell strings CS21 and CS22 in the second row may be connected in common with a string selection line SSL2d.

Likewise, second string selection transistors, which belong to the same row, from among the second string selection transistors SSTu at the same height are connected to the same string selection line, and second string selection transistors in different rows are connected to different string selection lines. For example, the second string selection transistors SSTu of the cell strings CS11 and CS12 in the first row are connected in common with a string selection line SSL1u, and the second string selection transistors SSTu of the cell strings CS21 and CS22 in the second row may be connected in common with a string selection line SSL2u.

In an embodiment, dummy memory cells at the same height are connected to the same dummy word line, and dummy memory cells at different heights are connected to different dummy word lines. For example, the first dummy memory cells DMC1 are connected to a first dummy word line DWL1, and the second dummy memory cells DMC2 are connected to a second dummy word line DWL2.

The second erase control transistors ECT2 of the cell strings CS11, CS12, CS21, and CS22 may be connected in common with a second erase control line ECL2. However, the present disclosure is not limited thereto. For example, the second erase control transistors ECT2 of the cell strings CS11, CS12, CS21, and CS22 may be controlled with different erase control lines.

In an embodiment, the memory block BLK illustrated in FIG. 2 is only an example. The number of cell strings may increase or decrease, and the number of rows of cell strings and the number of columns of cell strings may increase or decrease depending on the number of cell strings. Also, the number of cell transistors (e.g., GST, MC, DMC, and SST) in the memory block BLK may increase or decrease, and the height of the memory block BLK may increase or decrease depending on the number of cell transistors (e.g., GST, MC, DMC, and SST). Also, the number of lines (i.e., GSL, WL, DWL, and SSL) connected to cell transistors may increase or decrease depending on the number of cell transistors.

Figure 3:
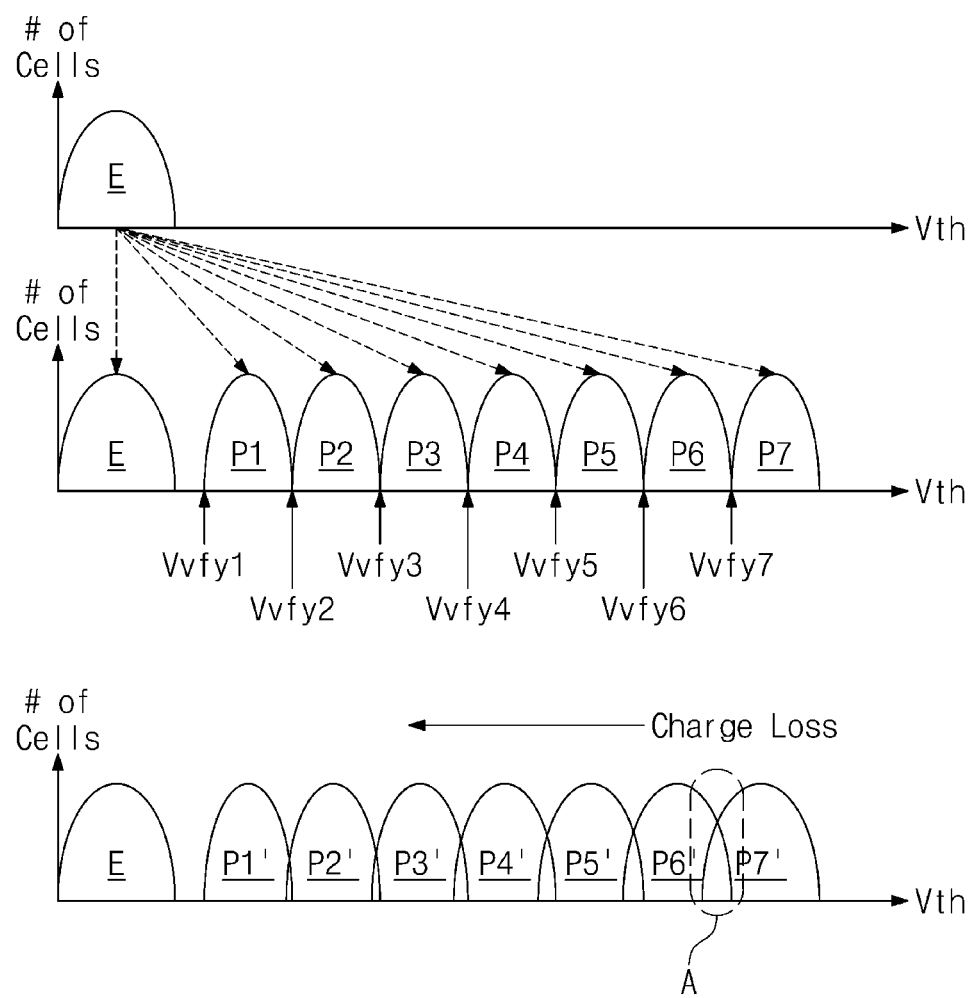
FIG. 3 is a diagram illustrating threshold voltage distributions of memory cells of FIG. 2.

FIG. 3 is a diagram illustrating threshold voltage distributions of memory cells of FIG. 2. In the distributions diagrams of FIG. 3, a horizontal axis represents a threshold voltage of a memory cell, and a vertical axis represents the number of memory cells. For convenience of description, it is assumed that each memory cell is a triple level cell configured to store 3-bit data. However, the present disclosure is not limited thereto. For example, each memory cell may be implemented in the form of a single level cell (SLC), multi-level cell (MLC), triple-level cell (TLC), quad-level cell (QLC), or penta-level cell (PLC).

Referring to FIGS. 1 to 3, the memory device 100 may store data in memory cells of the memory block BLK by controlling threshold voltages of the memory cells. For example, memory cells may be programmed to have one of an erase state "E" and first to seventh program states P1 to P7.

The memory device 100 may verify states of the memory cells by using a plurality of verify voltages Vvfy1 to Vvfy7. For example, the memory device 100 may verify whether memory cells corresponding to the first program state P1 are normally programmed, by using the first verify voltage Vvfy1. The memory device 100 may verify whether memory cells corresponding to the second program state P2 are normally programmed, by using the second verify voltage Vvfy2. Likewise, the memory device 100 may verify whether memory cells corresponding to the third to seventh program states P3 to P7 are normally programmed, by using the third to seventh verify voltages Vvfy3 to Vvfy7.

The memory device 100 may read data stored in memory cells by sensing program states (i.e., threshold voltages) of the memory cells.

In an embodiment, a threshold voltage of a memory cell may change due to various factors (e.g., an elapsed time, read disturb, program disturb, and word line coupling). For example, when charge loss occurs in memory cells, threshold voltages of the memory cell may decrease; in this case, as illustrated in FIG. 3, periods in which program states P1' to P7' of the memory cells overlap each other may occur. An error may occur in memory cells whose threshold voltages belong to the overlapping periods (e.g., region "A" of FIG. 3) of the program states P1' to P7', thereby causing the reduction of reliability of data stored in the memory cells.

Figure 4:
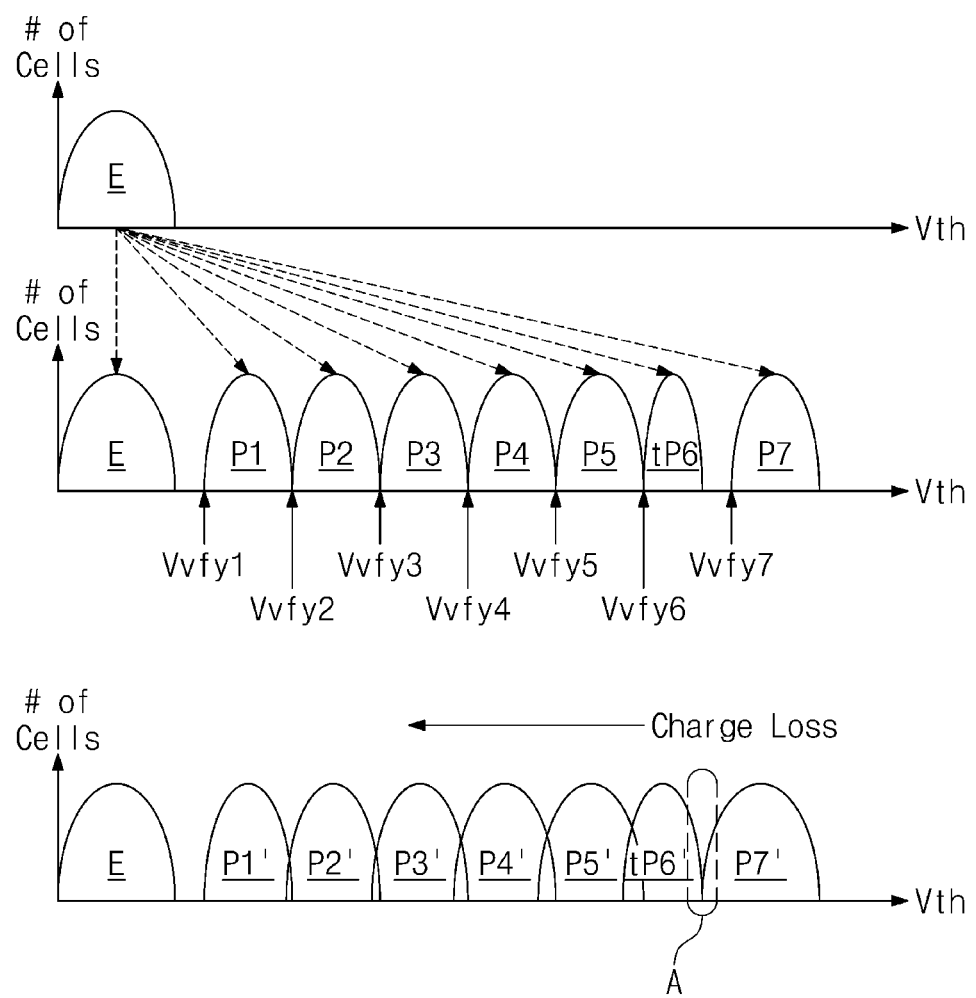
FIG. 4 is a diagram for describing a program operation of a memory device of FIG. 1.

FIG. 4 is a diagram for describing a program operation of a memory device of FIG. 1. Referring to FIGS. 1 to 4, the memory device 100 may program memory cells such that each memory cell has one of the erase state "E" and the first to seventh program states P1 to P7.

Figure 6:
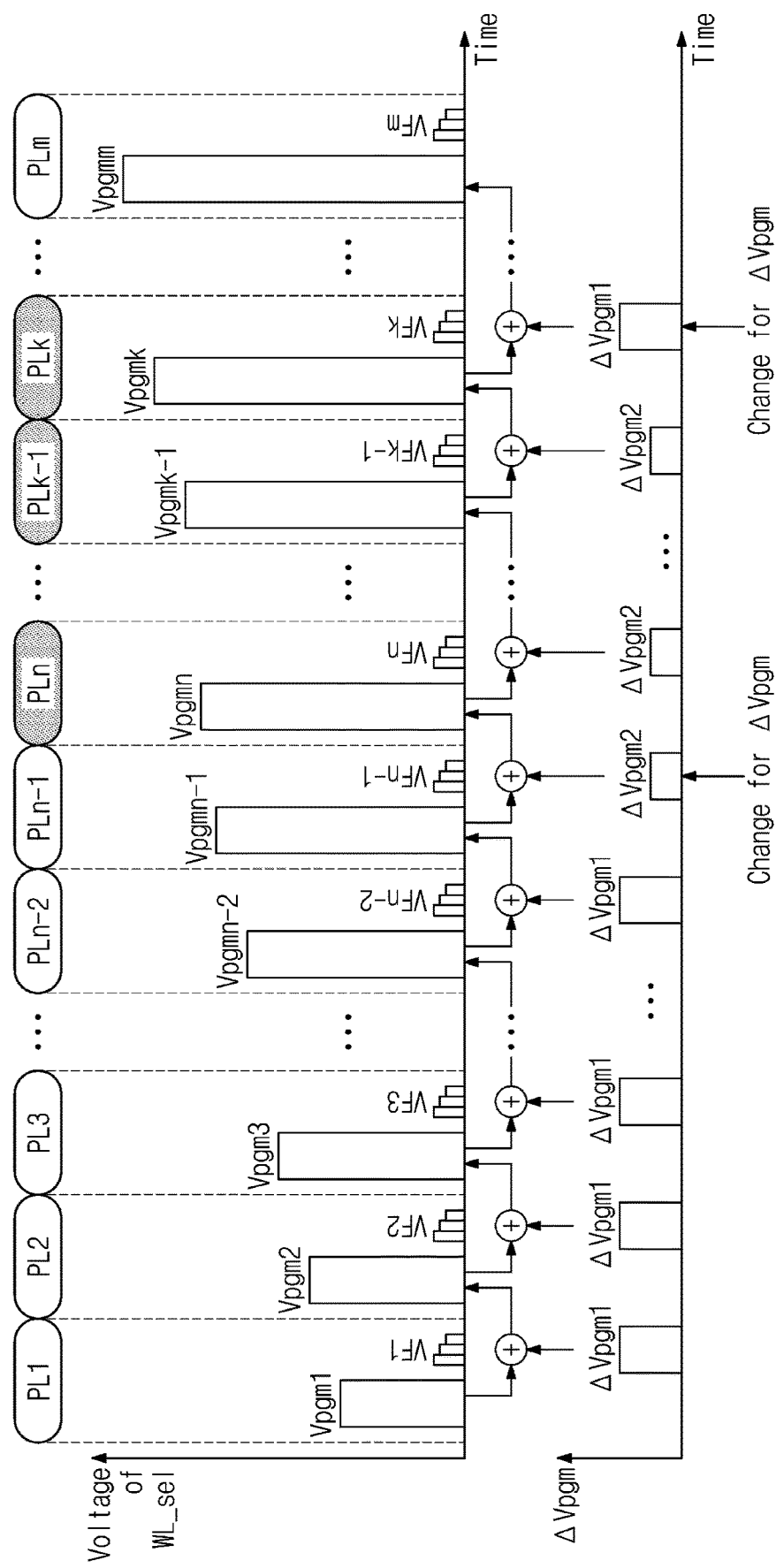
FIG. 6 is a diagram for describing a program operation of a memory device of FIG. 5.

In the embodiment of FIG. 4, the memory device 100 may perform the program operation such that memory cells corresponding to a specific program state (e.g., the sixth program state P6) are included in a relatively narrower threshold voltage range. For example, as illustrated in FIG. 6, the memory device 100 may program memory cells corresponding to the sixth program state P6 so as to have a sixth target program state tP6. The sixth target program state tP6 may have a relatively narrow threshold voltage distribution compared to the sixth program state P6 of FIG. 3. Alternatively, the sixth target program state tP6 may have a relatively low upper limit compared to the sixth program state P6 of FIG. 3.

As described above, in the case where the program operation is performed such that the memory cells corresponding to the sixth program state P6 have the sixth target program state tP6, even though the charge loss occurs in the memory cells, the area of an overlapping period (e.g., period "A" of FIG. 4) of the seventh program state P7 and the sixth program state P6 may decrease. In this case, the reliability of data stored in memory cells may be increased. Although the above example of the program operation is performed such that memory cells corresponding to the sixth program state P6 have a relatively narrower threshold voltage range in comparison to memory cells corresponding to program states P1-P5 and P7, the program operation may be performed on memory cells corresponding to other program states. For example, the program operation may be performed on memory cells corresponding to any one or more of program states P1-P7 such that the memory cells corresponding to the one or more program states have a relatively narrower threshold voltage range than the memory cells corresponding to the remaining program states.

As described above, the memory device 100 according to an embodiment of the present disclosure may perform the program operation such that threshold voltages of memory cells corresponding to a specific program state are included in a relatively narrow threshold voltage range in comparison to other program states. For example, even though threshold voltages of memory cells corresponding to a program state adjacent to the specific program state may change due to charge loss, because the area of the overlapping period described above is relatively small, the reliability of data stored in the memory cells may be secured.

In an embodiment, the memory device 100 may program memory cells by sequentially performing a plurality of program loops based on an incremental step pulse programming (ISPP) scheme. In an embodiment, the way to make a threshold voltage distribution range of memory cells corresponding to each program state relatively narrow may be implemented by decreasing the increment of a program voltage to be applied in each program loop. However, in the case where the program voltage increment decreases, the number of program loops may increase; in this case, the overall program speed or performance may be reduced.

According to an embodiment of the present disclosure, when a program loop corresponding to memory cells corresponding to a specific program state is performed, the memory device 100 may control various program parameters (e.g., an increment of a program voltage, a 2-step verify range, a bit line forcing voltage) to be used in the program loop. In the case where a program loop for a specific program state is completed, normal program parameters may be applied to program loops for subsequent program states. As such, a threshold voltage distribution of memory cells corresponding to the specific program state may be included in a relatively small range in a state where the reduction of program performance of the memory device 100 is minimized. Accordingly, the memory device 100 with increased performance and increased reliability is provided.

A program operation of the memory device 100 according to an embodiment of the present disclosure will be described in detail with reference to the following drawings. For convenience of description, it is assumed that the memory device 100 improves a threshold voltage distribution of memory cells corresponding to the sixth program state P6 (i.e., allows a threshold voltage distribution to be included in a specific range or decreases the upper limit of the threshold voltage distribution). However, the present disclosure is not limited thereto. It may be understood that a program scheme according to an embodiment of the present disclosure may be applied to other program states.

Figure 5:
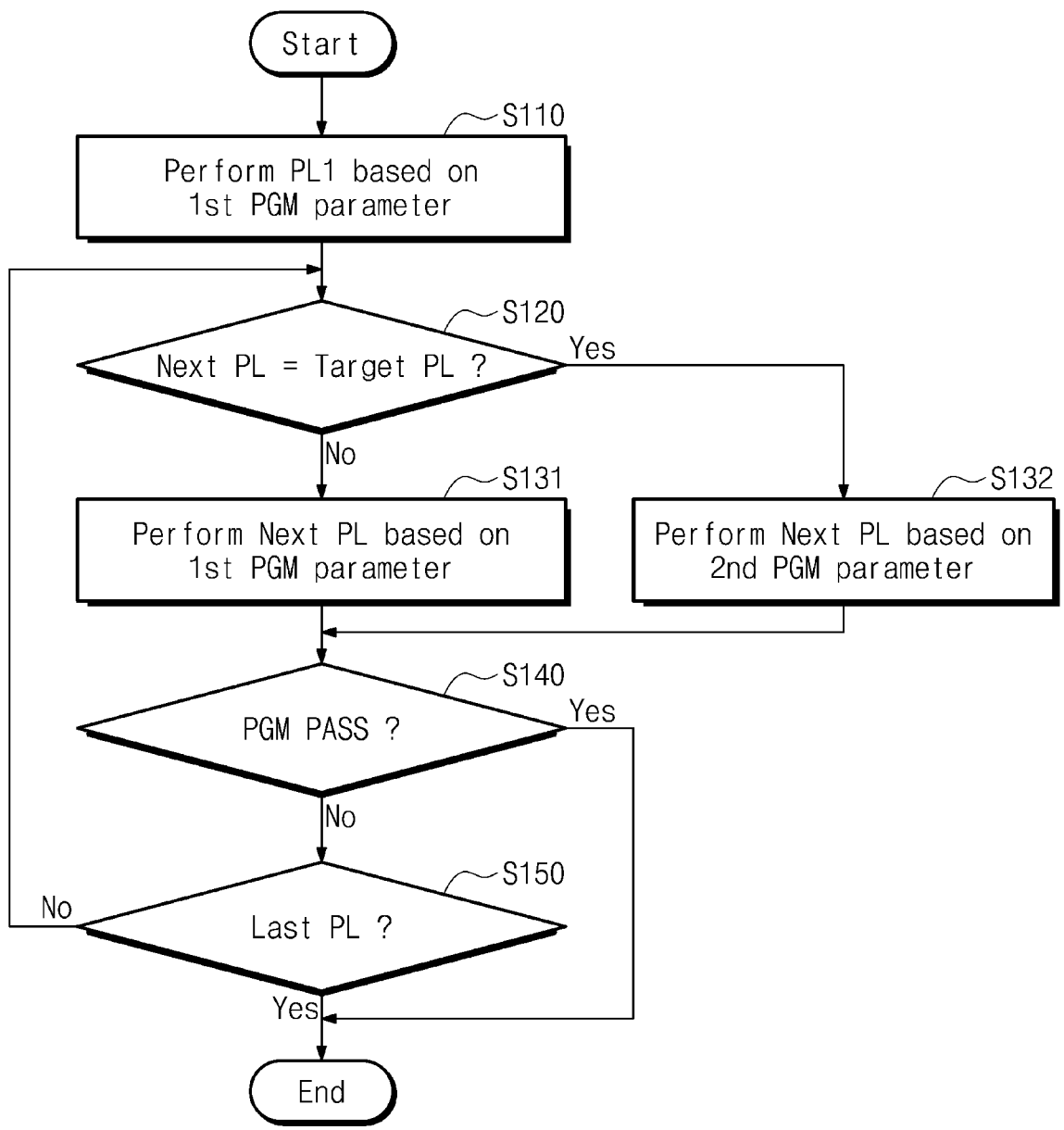
FIG. 5 is a flowchart illustrating a program operation of a memory device of FIG. 1.

FIG. 5 is a flowchart illustrating a program operation of a memory device of FIG. 1. Referring to FIGS. 1 and 5, in operation S110, the memory cell array 110 may perform a first program loop PL1 based on a first program parameter. For example, the memory device 100 may perform a program step of applying a program voltage set by the first program parameters to a selected word line, and may perform a verify step of applying a verify voltage for verifying a program state of memory cells to the selected word line. In an embodiment, the first program parameter may include a variety of information, which is used for the program operation, such as a start program voltage, an increment of a program voltage, a 2-step verify range, and a bit line forcing voltage.

In operation S120, the memory device 100 may determine whether a next program loop is a target program loop. For example, as described above, the memory device 100 may improve a threshold voltage distribution of memory cells corresponding to the sixth program state P6. In this case, the target program loop may indicate a program loop in which the verify step for the memory cells corresponding to the sixth program state P6 is performed. In an embodiment, whether the next program loop is the target program loop may be determined based on various schemes, and operation S120 will be described in detail with reference to FIGS. 13 to 15.

When the next program loop is not the target program loop (i.e., No in operation S120), in operation S131, the memory device 100 may perform the next program loop based on the first program parameter. When the next program loop is the target program loop (i.e., Yes in operation S120), in operation S132, the memory device 100 may perform the next program loop based on a second program parameter.

In an embodiment, the first program parameter and the second program parameter may be different from each other. For example, it is assumed that an a-th program loop is performed based on the first program parameter and a b-th program loop is performed based on the second program parameter. That is, in the a-th program loop, a verify operation may be performed on memory cells corresponding to a program state different from the sixth program state P6; in the b-th program loop, the verify operation may be performed on memory cells corresponding to the sixth program state P6.

In this case, an increment of the program voltage in the a-th program loop may be different from an increment of the program voltage in the b-th program loop. In this case, the increment of the program voltage in the b-th program loop may be smaller than the increment of the program voltage in the a-th program loop. That is, the memory device 100 may decrease the increment of the program voltage in the target program loop.

Alternatively, the 2-step verify range in the a-th program loop may be different from the 2-step verify range in the b-th program loop. In an embodiment, the 2-step verify range in the b-th program loop may be wider than the 2-step verify range in the a-th program loop. That is, the memory device 100 may make the 2-step verify range wide in the target program loop.

Alternatively, the bit line forcing voltage in the a-th program loop may be different from the bit line forcing voltage in the b-th program loop. In an embodiment, the bit line forcing voltage in the b-th program loop may be smaller than the bit line forcing voltage in the a-th program loop. That is, the memory device 100 may decrease the bit line forcing voltage in the target program loop.

Afterwards, in operation S140, the memory device 100 may determine whether the program operation passes. For example, the memory device 100 may determine whether all the memory cells connected to the selected word line or the remaining memory cells other than some of the memory cells connected to the selected word line are normally programmed. In the case where the memory cells are normally programmed (i.e., in the case where the program operation passes), the memory device 100 may terminate the program operation.

In the case where the memory cells are not normally programmed (i.e., in the case where the program operation fails or in the case where memory cells not yet programmed exist), in operation S150, the memory device 100 may determine whether the currently performed program loop (or current program loop) is the last program loop. For example, the program loop may be performed in the memory device 100 as much as the given number of times. The memory device 100 may determine whether the number of performed program loops reaches the given number of times (i.e., whether the last program loop is performed).

When the current program loop is not the last program loop (i.e., a program loop(s) to be performed exists), the memory device 100 performs operation S120. When the current program loop is the last program loop (i.e., a program loop(s) to be performed does not exist), the memory device 100 terminates the program operation. In an embodiment, in the case where the last program loop is completed without the program pass, the memory device 100 may process the program operation as a program fail.

As described above, the memory device 100 may control the increment of the program voltage, the 2-step verify range, or the bit line forcing voltage in the specific program loop corresponding to the specific program state (e.g., P6). In this case, a range of a threshold voltage distribution of memory cells programmed to the specific program state (e.g., P6) through the specific program loop may be included in a specific range (or a relatively narrow range) (or may be formed to be narrower than those corresponding to the remaining program states).

FIG. 6 is a diagram for describing a program operation of a memory device of FIG. 5. An embodiment in which an increment of a program voltage is controlled in a specific program loop will be described with reference to FIG. 6.

Referring to FIGS. 1, 5, and 6, the memory device 100 may perform the program operation through a plurality of program loops PL1 to PLm. Each of the plurality of program loops PL1 to PLm may include the program step of applying a program voltage (e.g., each of Vpgm1 to Vpgmm) to a selected word line WL_sel, and the verify step of applying each of a set of verify voltages (e.g., each of VF1 to VFm) to the selected word line WL_sel. In an embodiment, the verify voltage set of each verify step may include some of the plurality of verify voltages Vvfy1 to Vvfy7 described with reference to FIG. 4.

As described above, the memory device 100 may control a program voltage increment $\Delta$Vpgm in a specific program loop. For example, in the first program loop PL1, the memory device 100 may increase threshold voltages of memory cells connected to the selected word line WL_sel by applying a first program voltage Vpgm1 to the selected word line WL_sel. The memory device 100 may verify program states of the memory cells connected to the selected word line WL_sel by applying a first verify voltage set VF1 to the selected word line WL_sel. In an embodiment, the first verify voltage set VF1 may include some verify voltages of the plurality of verify voltages Vvfy1 to Vvfy7; in the first program loop PL1, program states corresponding to the verify voltages included in the first verify voltage set VF1 may be verified.

Next, in the second program loop PL2, the memory device 100 may apply a second program voltage Vpgm2 to the selected word line WL_sel. In the second program loop PL2, the memory device 100 may verify program states of the memory cells connected to the selected word line WL_sel by applying a second verify voltage set VF2 to the selected word line WL_sel. In an embodiment, the second verify voltage set VF2 may be the same as the first verify voltage set VF1. Alternatively, some of the second verify voltage set VF2 may be different from some of the first verify voltage set VF1. Alternatively, all verify voltages of the second verify voltage set VF2 may be different from all verify voltages of the first verify voltage set VF1.

In the third program loop PL3, the memory device 100 may apply a third program voltage Vpgm3 to the selected word line WL_sel in the program step and may apply a third verify voltage set VF3 to the selected word line WL_sel in the verify step. In the (n−2)-th program loop PLn−2, the memory device 100 may apply an (n−2)-th program voltage Vpgmn−2 to the selected word line WL_sel in the program step and may apply an (n−2)-th verify voltage set VFn−2 to the selected word line WL_sel in the verify step. In the (n−1)-th program loop PLn−1, the memory device 100 may apply an (n−1)-th program voltage Vpgmn−1 to the selected word line WL_sel in the program step and may apply an (n−1)-th verify voltage set VFn−1 to the selected word line WL_sel in the verify step.

In the n-th program loop PLn, the memory device 100 may apply an n-th program voltage Vpgmn to the selected word line WL_sel in the program step and may apply an n-th verify voltage set VFn to the selected word line WL_sel in the verify step. In an embodiment, in the n-th program loop PLn, memory cells of a specific program state (e.g., the sixth program state P6) may be programmed or verified. That is, the n-th verify voltage set VFn may include the sixth verify voltage Vvfy6 for verifying the sixth program state P6.

In this case, the memory device 100 may adjust or decrease the program voltage increment ΔVpgm of the n-th program voltage Vpgmn used in the n-th program loop PLn. For example, each of the program voltages Vpgm1 to Vpgmn−1 used in the first to (n−1)-th program loops PL1 to PLn−1 may be increased as much as a first program voltage increment ΔVpgm1, compared to a program voltage of a previous program loop. For example, the second program voltage Vpgm2 may be greater than the first program voltage Vpgm1 as much as the first program voltage increment ΔVpgm1; the third program voltage Vpgm3 may be greater than the second program voltage Vpgm2 as much as the first program voltage increment ΔVpgm1; the (n−1)-th program voltage Vpgmn−1 may be greater than the (n−2)-th program voltage Vpgmn−2 as much as the first program voltage increment ΔVpgm1.

In contrast, in a program loop (e.g., PLn) in which memory cells corresponding to a specific program state P6 are programmed or verified, a program voltage used in the specific program loop PLn may be increased as much as a second program voltage increment ΔVpgm2, compared to a program voltage of a previous program loop. For example, the n-th program voltage Vpgmn of the n-th program loop PLn may be greater than the (n−1)-th program voltage Vpgmn−1 of the (n−1)-th program loop PLn−1 as much as the second program voltage increment ΔVpgm2. In an embodiment, the second program voltage increment ΔVpgm2 may be smaller than the first program voltage increment ΔVpgm1. Alternatively, the second program voltage increment ΔVpgm2 may be 0.5 times the first program voltage increment ΔVpgm1, but the present disclosure is not limited thereto.

In the (k−1)-th program loop PLk−1, the memory device 100 may apply a (k−1)-th program voltage Vpgmk−1 to the selected word line WL_sel in the program step and may apply a (k−1)-th verify voltage set VFk−1 to the selected word line WL_sel in the verify step. In the k-th program loop PLk, the memory device 100 may apply a k-th program voltage Vpgmk to the selected word line WL_sel in the program step and may apply a k-th verify voltage set VFk to the selected word line WL_sel in the verify step. In the m-th program loop PLm, the memory device 100 may apply an m-th program voltage Vpgmm to the selected word line WL_sel in the program step and may apply an m-th verify voltage set VFm to the selected word line WL_sel in the verify step.

In an embodiment, in the k-th program loop PLk, the memory cells corresponding to the specific program state (e.g., the sixth program state P6) may be completely programmed. In this case, the memory device 100 may control the program voltage increment ΔVpgm. For example, in the n-th to k-th program loops PLn to PLk in which program and verify operations are performed on the memory cells corresponding to the specific program state (e.g., P6), the program voltage Vpgm may be stepwise increased based on the second program voltage increment ΔVpgm2. After the k-th program loop PLk (i.e., after the memory cells corresponding to the specific program state (e.g., P6) are completely programmed), the memory device 100 may increase the program voltage Vpgm back to the first program voltage increment ΔVpgm1.

In an embodiment, in the ISPP-based program operation, in the case where a program voltage increment decreases, since threshold voltages of memory cells may be controlled relatively finely, a threshold voltage distribution of the memory cells may be easily included in a specific range. As described above, the memory device 100 according to an embodiment of the present disclosure may include a threshold voltage distribution of memory cells corresponding to a specific program state in a relatively narrow range by controlling or decreasing a program voltage increment in program loops (e.g., PLn to PLk) corresponding to the specific program state P6. In this case, an error margin between the specific program state P6 and another program state adjacent thereto may be improved.

In an embodiment, in the ISPP-based program operation, in the case where a program voltage increment decreases in all the program loops, the number of program loops that are performed until the program operation is completed increases. In this case, the performance of the program operation may be reduced. In contrast, the memory device 100 according to an embodiment of the present disclosure may control or decrease a program voltage increment only in a program loop corresponding to a specific program state, and thus, the reduction of performance of the program operation may be minimized.

FIGS. 7A, 7B, 8A, and 8B are diagrams for describing a program operation of a memory device of FIG. 5. An embodiment in which a bit line forcing voltage is controlled in a specific program loop corresponding to a specific program state will be described with reference to FIGS. 7A, 7B, 8A, and 8B. For brief description, how a threshold voltage distribution of memory cells corresponding to the sixth program state P6 is improved will be described based on memory cells to be programmed to the fifth and sixth program states P5 and P6. However, the present disclosure is not limited thereto.

Figure 7A:
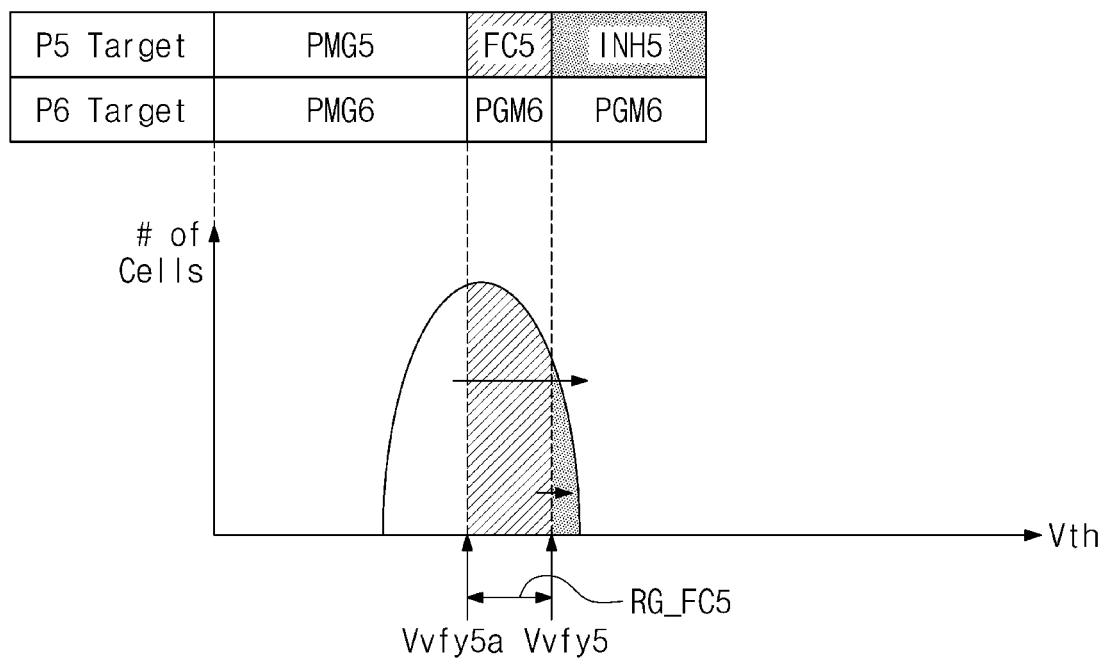
FIGS. 7A, 7B, 8A, and 8B are diagrams for describing a program operation of a memory device of FIG. 5.

Referring to FIGS. 1, 4, 5, 7A, and 7B, memory cells MCa to MCf connected to the selected word line WL_sel may form a threshold voltage distribution as illustrated in FIG. 7A. In this case, to verify a program state of memory cells (e.g., MCa, MCb, and MCc) to be programmed to the fifth program state P5, the memory device 100 may perform the 2-step verify operation by using the fifth verify voltage Vvfy5 and a 5a-th verify voltage Vvfy5a. In an embodiment, the 2-step verify operation may indicate an operation of classifying the memory cells MCa, MCb, and MCc to be programmed to the fifth program state P5 into 1) a memory cell whose threshold voltage is greater than the fifth verify voltage Vvfy5, 2) a memory cell whose threshold voltage is between the fifth verify voltage Vvfy5 and the 5a-th verify voltage Vvfy5a, and 3) a memory cell whose threshold voltage is smaller than the 5a-th verify voltage Vvfy5a. In an embodiment, a range defined by the fifth verify voltage Vvfy5 and the 5a-th verify voltage Vvfy5a may correspond to a fifth 2-step verify range RG_FC5.

The memory cell, which has a threshold voltage greater than the fifth verify voltage Vvfy5, from among the memory cells MCa, MCb, and MCc to be programmed to the fifth program state P5 may be a memory cell completely programmed to the fifth program state P5 and may be determined to be in a fifth program-inhibit state INH5.

The memory cell, which has a threshold voltage between the fifth verify voltage Vvfy5 and the 5a-th verify voltage Vvfy5a, from among the memory cells MCa, MCb, and MCc to be programmed to the fifth program state P5 may be a memory cell whose threshold voltage is adjacent to the fifth program state P5 and may be determined to be in a fifth forcing state FC5.

The memory cell, which has a threshold voltage smaller than the 5a-th verify voltage Vvfy5a, from among the memory cells MCa, MCb, and MCc to be programmed to the fifth program state P5 may be a memory cell not programmed to the fifth program state P5 and may be determined to be in a fifth program progress state PGM5.

In an embodiment, in the 2-step verify operation of FIG. 7A, memory cells to be programmed to the sixth program state P6 may be determined to be in a sixth program progress state PGM6. In an embodiment, in the 2-step verify operation of FIG. 7A, the verify operation for the memory cells to be programmed to the sixth program state P6 may be omitted.

Figure 7B:
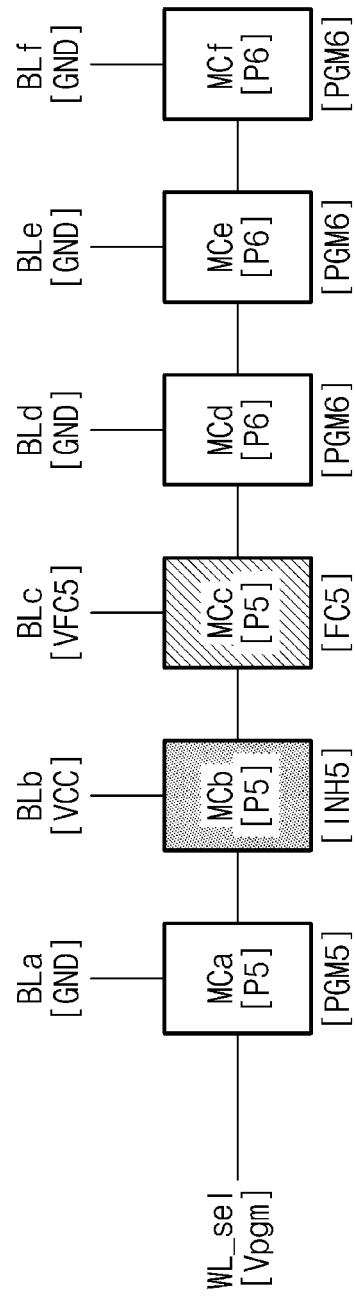

After the 2-step verify operation described with reference to FIG. 7A is performed, a next program loop may be performed based on a verification result. For example, as illustrated in FIG. 7B, in the memory cells MCa to MCf connected to the selected word line WL_sel, the a-th to c-th memory cells MCa to MCc may be memory cells to be programmed to the fifth program state P5, and the d-th to f-th memory cells MCd to MCf may be memory cells to be programmed to the sixth program state P6.

After the 2-step verify operation of FIG. 7A, the a-th memory cell MCa may be determined to be in the fifth program progress state PGM5, the b-th memory cell MCb may be determined to be in the fifth program-inhibit state INH5, and the c-th memory cell MCc may be determined to be in the fifth forcing state FC5. The d-th to f-th memory cells MCd to MCf may be determined to be in the sixth program progress state PGM6.

In a program loop following the 2-step verify operation of FIG. 7A, the memory device 100 may apply the corresponding program voltage Vpgm to the selected word line WL_sel and may apply various voltages to a plurality of bit lines BLa to BLf depending on results of verifying memory cells. For example, the memory device 100 may apply a ground voltage GND to the a-th bit line BLa connected to the a-th memory cell MCa of the fifth program progress state PGM5, may apply a power supply voltage VCC to the b-th bit line BLb (i.e., a program-inhibit voltage) connected to the b-th memory cell MCb of the fifth program-inhibit state INH5, and may apply a fifth bit line forcing voltage VFC5 to the c-th bit line BLc connected to the c-th memory cell MCc of the fifth bit line forcing voltage VFC5. The memory device 100 may apply the ground voltage GND to d-th to f-th bit lines BLd to BLf connected to the d-th to f-th memory cells MCd to MCf of the sixth program progress state PGM6.

Threshold voltages of the memory cells MCa, MCd, MCe, and MCf (i.e., memory cells of a program progress state) corresponding to the bit lines BLa, BLd, BLe, and BLf to which the ground voltage GND is applied may be increased by the program voltage Vpgm. That is, the memory cells MCa, MCd, MCe, and MCf corresponding to the bit lines BLa, BLd, BLe, and BLf to which the ground voltage GND is applied may be programmed.

As a channel of the memory cell MCb (i.e., a memory cell of a program-inhibit state) corresponding to the bit line BLb to which the power supply voltage VCC (i.e., program-inhibit voltage) is applied is boosted, a threshold voltage of the memory cell MCb may not change. That is, the memory cell MCb (i.e., a memory cell of a program-inhibit state) corresponding to the bit line BLb to which the power supply voltage VCC is applied may be program-inhibited.

A threshold voltage of the memory cell MCc (i.e., a memory cell of a forcing state) corresponding to the bit line BLc to which the fifth bit line forcing voltage VFC5 is applied may be increased by the fifth bit line forcing voltage VFC5 and the program voltage Vpgm. In an embodiment, an increment of the threshold voltage of the memory cell MCc corresponding to the bit line BLc to which the fifth bit line forcing voltage VFC5 is applied may be smaller than an increment of threshold voltages of the memory cells MCa, MCd, MCe, and MCf corresponding to the bit lines BLa, BLd, BLe, and BLf to which the ground voltage GND is applied. The reason is that an effective program voltage for the c-th memory cell MCc is decreased by the fifth bit line forcing voltage VFC5 applied to the c-th bit line BLc as much as the fifth bit line forcing voltage VFC5. That is, in the case where the fifth bit line forcing voltage VFC5 is applied to a bit line, a threshold voltage of a memory cell may be finely controlled.

Figure 8A:
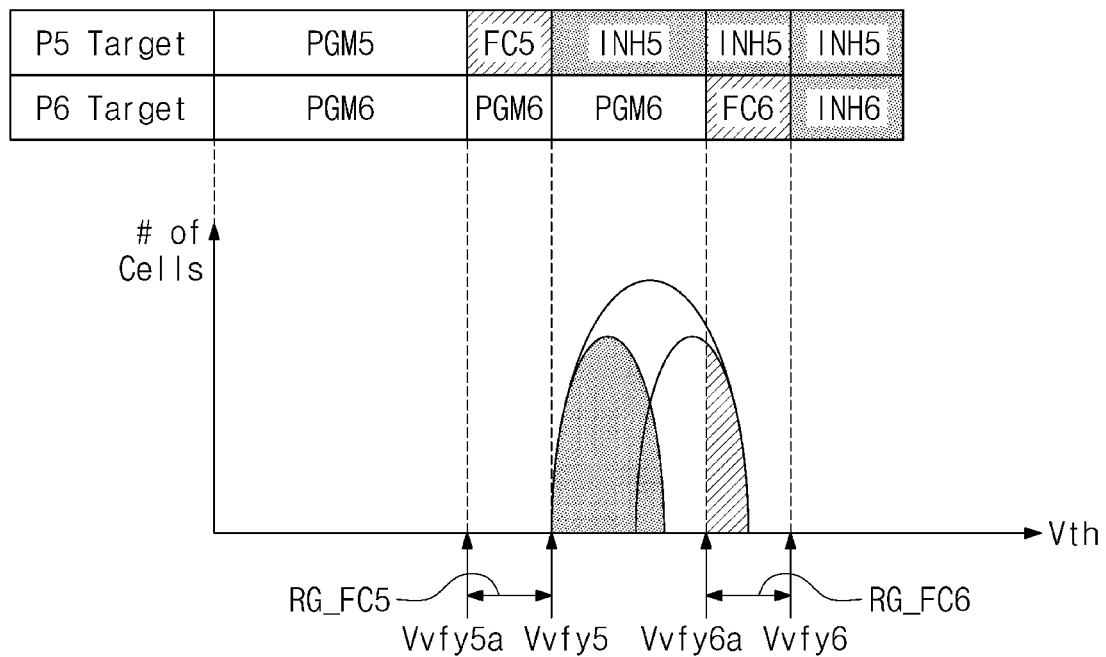

After the operation of FIG. 7B, the memory cells MCa to MCf may form a threshold voltage distribution as illustrated in FIG. 8A. As in the above description given with reference to FIG. 7A, the memory device 100 may perform the 2-step verify operation. For example, the memory device 100 may verify the memory cells MCa, MCb, and MCc to be programmed to the fifth program state P5 by using the fifth and 5a-th verify voltage Vvfy5 and Vvfy5a and may verify the memory cells MCd, MCe, and MCf to be programmed to the sixth program state P6 by using the sixth verify voltage Vvfy6 and a 6a-th verify voltage Vvfy6a.

As illustrated in FIG. 8A, because all the memory cells (e.g., MCa, MCb, and MCc) to be programmed to the fifth program state P5 have threshold voltages greater than the fifth verify voltage Vvfy5, the memory cells may be determined to be in the fifth program-inhibit state INH5.

A memory cell, which has a threshold voltage greater than the sixth verify voltage Vvfy6, from among the memory cells MCd, MCe, and MCf to be programmed to the sixth program state P6 may be a memory cell completely programmed to the sixth program state P6 and may be determined to be in a sixth program-inhibit state INH6.

A memory cell, which has a threshold voltage between the sixth and 6a-th verify voltages Vvfy6 and Vvfy6a, from among the memory cells MCd, MCe, and MCf to be programmed to the sixth program state P6 may be a memory cell not completely programmed to the sixth program state P6 and may be determined to be in a sixth forcing state FC6.

A memory cell, which has a threshold voltage smaller than the 6a-th verify voltage Vvfy6a, from among the memory cells MCd, MCe, and MCf to be programmed to the sixth program state P6 may be a memory cell not programmed to the sixth program state P6 and may be determined to be in the sixth program progress state PGM6.

In an embodiment, a range defined by the sixth verify voltage Vvfy6 and the 6a-th verify voltage Vvfy6a may correspond to a sixth 2-step verify range RG_FC6.

Figure 8B:
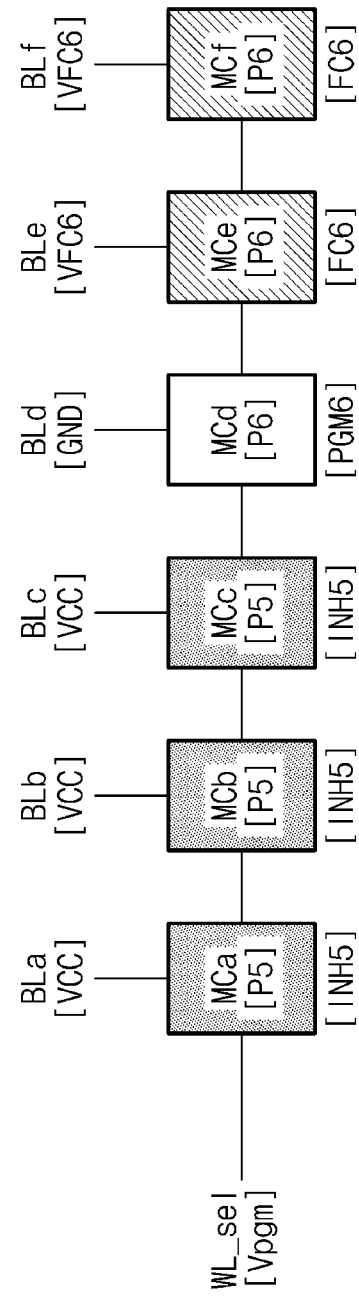

After the 2-step verify operation of FIG. 8A, the memory device 100 may apply the corresponding program voltage Vpgm to the selected word line WL_sel and may apply various voltages to the plurality of bit lines BLa to BLf depending on results of verifying memory cells. For example, as illustrated in FIG. 8B, the a-th to c-th memory cells MCa, MCb, and MCc to be programmed to the fifth program state P5 may be in the fifth program-inhibit state INH5, the d-th memory cell MCd of the d-th to f-th memory cells MCd to MCf to be programmed to the sixth program state P6 may be in the sixth program progress state PGM6, and the e-th and f-th memory cells MCe and MCf of the d-th to f-th memory cells MCd to MCf may be in the sixth forcing state FC6.

In this case, the memory device 100 may apply the power supply voltage VCC to the a-th to c-th bit lines BLa, BLb, and BLc, may apply the ground voltage GND to the d-th bit lines BLd, and may apply a sixth bit line forcing voltage VFC6 to the e-th and f-th bit lines BLe and BLf. How threshold voltages of memory cells change depending on voltages of bit lines is described above, and thus, additional description will be omitted to avoid redundancy.

In an embodiment, according to an embodiment of the present disclosure, the memory device 100 may improve a threshold voltage distribution of memory cells corresponding to a specific program state (e.g., P6) (i.e., may include the threshold voltage distribution thereof in a specific range). In this case, the sixth bit line forcing voltage VFC6 that is applied to bit lines of memory cells to be programmed to the sixth program state P6 may be different in level from another bit line forcing voltage (e.g., VFC5).

For example, as described above, according to an embodiment of the present disclosure, the memory device 100 may improve a threshold voltage distribution of memory cells corresponding to the sixth program state P6. In this case, in the program operation, there may be required an operation of finely controlling threshold voltages of the memory cells corresponding to the sixth program state P6. To this end, the memory device 100 may make the sixth bit line forcing voltage VFC6 greater than another bit line forcing voltage VFC5 such that a magnitude of an effective program voltage to be applied to memory cells to be programmed to the sixth program state P6 decreases. As described above, the sixth bit line forcing voltage VFC6 may be applied to bit lines corresponding to the memory cells to be programmed to the sixth program state P6.

In an embodiment, the memory device 100 may control the program voltage increment ΔVpgm described with reference to FIG. 6 and the bit line forcing voltage described with reference to FIGS. 7A to 8B together. That is, with regard to specific program loops corresponding to a specific program state (e.g., P6), the memory device 100 may control the program voltage increment ΔVpgm and the bit line forcing voltage VFC. For example, in a specific program loop, the memory device 100 may decrease the program voltage increment ΔVpgm and may decrease the bit line forcing voltage VFC.

For example, it is assumed that a first program voltage increment ΔVpgm1 in a normal program loop is 0.6 V, a second program voltage increment ΔVpgm2 in a specific program loop is 0.3 V, and the bit line forcing voltage VFC is 0.3 V. In this case, in the normal program loop, an effective program voltage increment associated with a memory cell connected to a bit line to which a bit line forcing voltage is applied may be 0.3 V (i.e., ΔVpgm1 [0.6V]−VFC [0.3V]=0.3V). In contrast, in the specific program loop, an effective program voltage increment associated with the memory cell connected to the bit line to which the bit line forcing voltage is applied may be 0 V (i.e., ΔVpgm2 [0.3V]−VFC [0.3V]=0 V). That is, in the case where a program voltage increment decreases in a specific program loop, an effective program voltage increment associated with some memory cells may be 0 V in a state where a bit line forcing voltage is not controlled or increases. In this case, threshold voltages of some memory cells may not change or may slightly change. This may mean that the memory cells are not programmed normally or a program time increases.

Accordingly, in the case where a program voltage increment decreases in a specific program loop corresponding to a specific program state, the memory device 100 according to an embodiment of the present disclosure may decrease a bit line forcing voltage corresponding to the specific program state. In an embodiment, a decreasing ratio of the program voltage increment in the specific program loop may be the same as a decreasing ratio of the bit line forcing voltage in the specific program loop.

Figure 9:
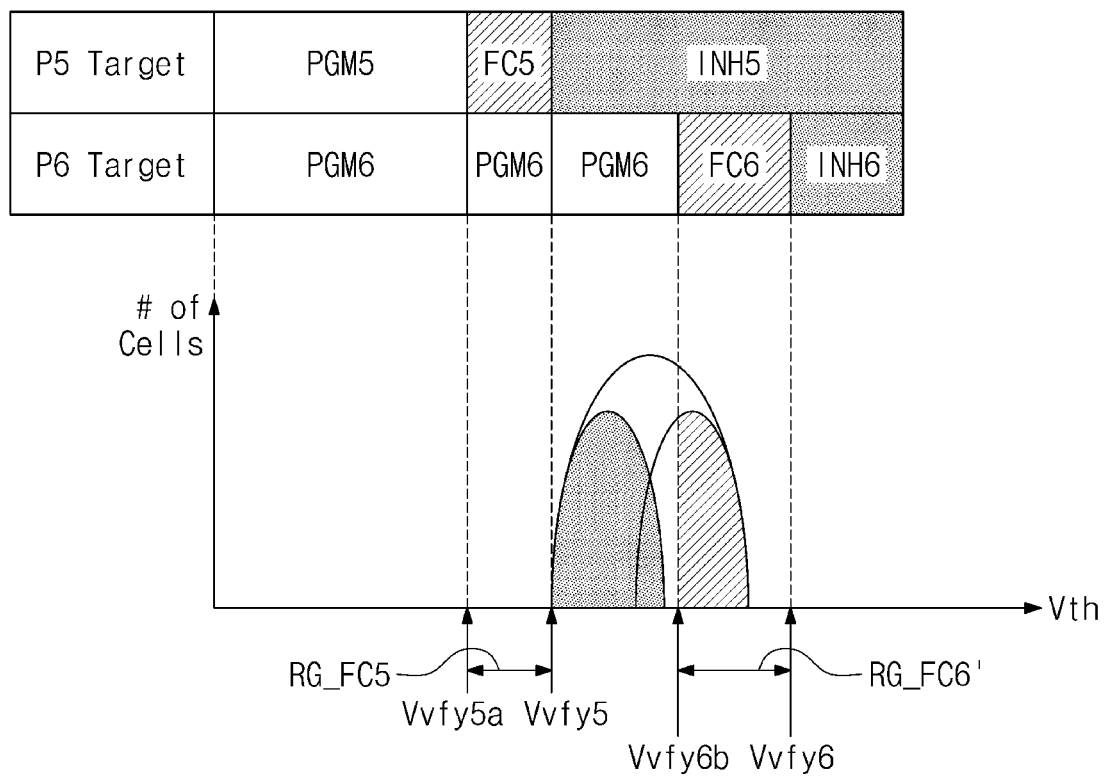
FIG. 9 is a diagram for describing a program operation of a memory device of FIG. 5.

FIG. 9 is a diagram for describing a program operation of a memory device of FIG. 5. An embodiment in which a 2-step verify range is controlled in a specific program loop will be described with reference to FIG. 9. For convenience of description, additional description associated with the components described above will be omitted to avoid redundancy.

Referring to FIGS. 5 and 9, the memory device 100 may perform the 2-step verify operation as illustrated in FIG. 9. In this case, the memory device 100 may perform the 2-step verify operation on memory cells to be programmed to the fifth program state P5 by using the fifth verify voltage Vvyf5 and a 5b-th verify voltage Vvfy5a and may perform the 2-step verify operation on memory cells to be programmed to a specific sixth program state (e.g., P6) by using the sixth verify voltage Vvyf6 and a 6b-th verify voltage Vvfy6b.

In an embodiment, a range defined by the fifth and 5a-th verify voltages Vvfy5 and Vvfy5a may be the fifth 2-step verify range RG_FC5, and a range defined by the sixth and 6b-th verify voltages Vvfy6 and Vvfy6b may be a sixth 2-step verify range RG_FC6'.

Unlike the embodiment of FIG. 8A, in the embodiment of FIG. 9, the 2-step verify range (e.g., RG_FC6') associated with the specific program state (e.g., P6) may be controlled. For example, in the embodiment of FIG. 8A, 2-step verify voltages corresponding to respective program states may be different from each other, but 2-step verify ranges being differences between verify voltages may be the same. In contrast, in the embodiment of FIG. 9, the sixth 2-step verify range RG_FC6' associated with the sixth program state P6 corresponding to the specific program state may be different from another 2-step verify range (e.g., RG_FC5). In an embodiment, the sixth 2-step verify range RG_FC6' may be wider than the another 2-step verify range (e.g., RG_FC5). In the case where the sixth 2-step verify range RG_FC6' associated with the sixth program state P6 corresponding to the specific program state is wider than the another 2-step verify range (e.g., RG_FC5), the number of memory cells determined to be in the sixth forcing state FC6 may increase, and thus, threshold voltages of memory cells to be programmed to the sixth program state P6 may be controlled more finely.

Figure 10:
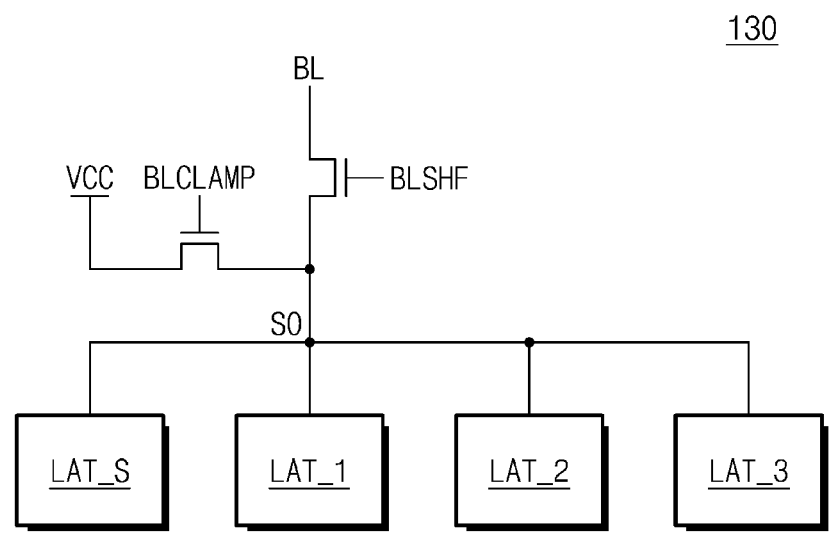
FIG. 10 is a block diagram illustrating a page buffer circuit of a memory device of FIG. 1.
Figure 11A:
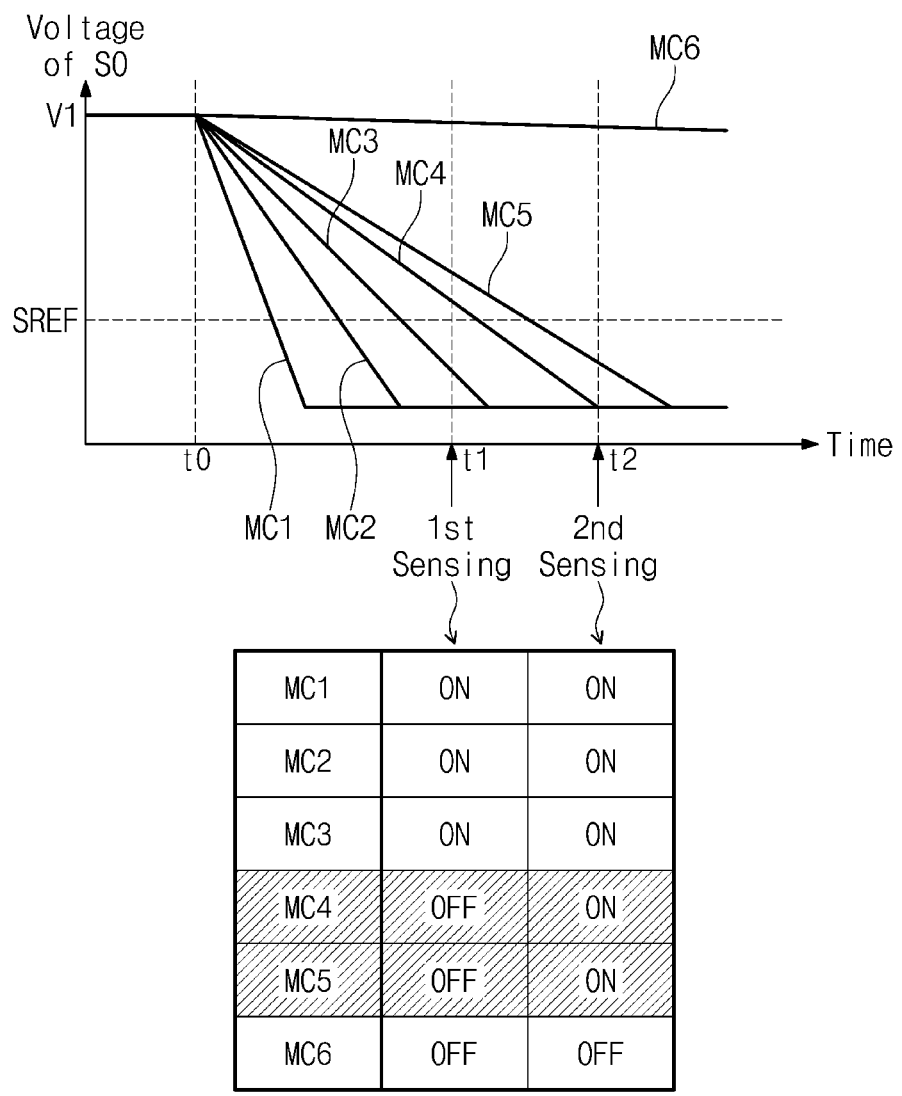
FIGS. 11A and 11B are timing diagrams for describing an operation of a page buffer circuit of FIG. 10.
Figure 11B:
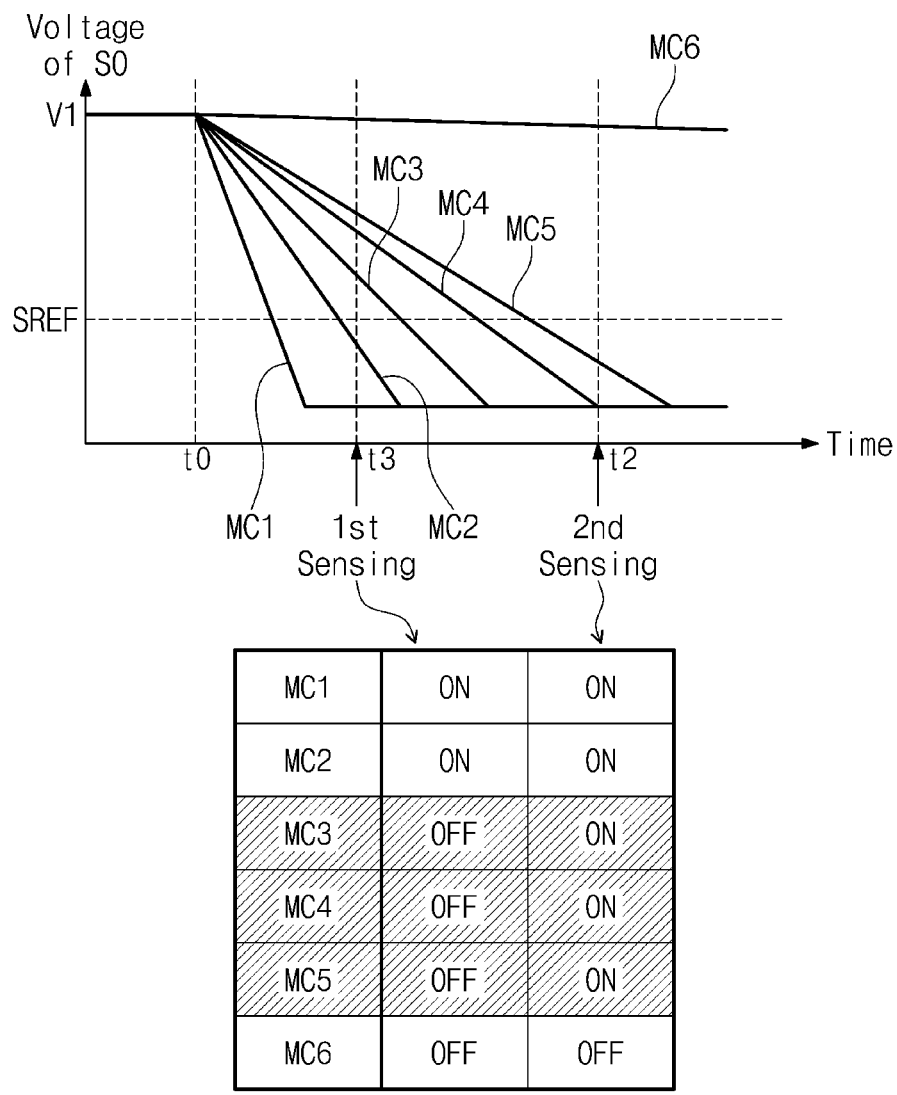

FIG. 10 is a block diagram illustrating a page buffer circuit of a memory device of FIG. 1. FIGS. 11A and 11B are timing diagrams for describing an operation of a page buffer circuit of FIG. 10. In FIGS. 11A and 11B, a horizontal axis represents a time, and a vertical axis represents a voltage of a sensing node SO. In an embodiment, an operation of controlling a 2-step verify range will be described with reference to FIGS. 10, 11A, and 11B.

Referring to FIGS. 1, 10, 11A, and 11B, the page buffer circuit 130 may include a plurality of latches LAT_S, LAT_1, LAT_2, and LAT_3 connected to the bit line BL. The sensing latch LAT_S may be connected to the sensing node SO and may be configured to latch data depending on a voltage of the sensing node SO. The first to third data latches LAT_1, LAT_2, and LAT_3 may be configured to temporarily store data to be stored in the memory cell array 110 or to temporarily store data read from the memory cell array 110.

A transistor configured to operate in response to a bit line shut-off signal BLSHF may be placed between the bit line BL and the sensing node SO. A transistor configured to operate in response to a bit line clamp signal BLCLAMP may be placed between the sensing node SO and the power supply voltage VCC. In an embodiment, the structure of the page buffer circuit 130 illustrated in FIG. 10 is only an example, and the present disclosure is not limited thereto.

In an embodiment, as described above, the 2-step verify operation refers to an operation of verifying states of memory cells corresponding to one program state by using two verify voltages. In this case, the 2-step verify operation may be performed by applying two verify voltages to a selected word line.

Alternatively, the 2-step verify operation may be performed through two sensing operations performed at different timings in the page buffer circuit 130 in a state where one verify voltage is applied to the selected word line.

For example, as illustrated in FIG. 11A, in the 2-step verify operation, the sensing node SO may be precharged to a first voltage V1. At a 0-th point in time t0, the sensing node SO may be connected to the bit line BL, and a voltage of the sensing node SO may change depending on a state of a memory cell.

For example, it is assumed that the fifth verify voltage Vvfy5 is applied to a word line connected to memory cells. In this case, a ratio or slope at which a voltage of the sensing node SO decreases may be variable depending on threshold voltages of memory cells MC1 to MC6.

After a given time passes from the 0-th point in time t0, the page buffer circuit 130 may perform a first sensing operation at a first point in time t1 and may perform a second sensing operation at a second point in time t2. For example, at the first point in time t1, the page buffer circuit 130 may determine a turn-on state ON or a turn-off state OFF of a memory cell by comparing a voltage of the sensing node SO and a sensing reference voltage SREF. As illustrated in FIG. 11A, at the first point in time t1, because a voltage of the sensing node SO corresponding to each of the first to third memory cells MC1 to MC3 is smaller than the sensing reference voltage SREF, the first to third memory cells MC1 to MC3 may be determined to be in the turn-on state ON. At the first point in time t1, because a voltage of the sensing node SO corresponding to each of the fourth to sixth memory cells MC4 to MC6 is greater than the sensing reference voltage SREF, the fourth to sixth memory cells MC4 to MC6 may be determined to be in the turn-off state OFF. A result of the first sensing operation may be temporarily stored in the sensing latch LAT_S described with reference to FIG. 10.

At the second point in time t2 when a given time passes from the first point in time t1, the page buffer circuit 130 may perform the second sensing operation. As illustrated in FIG. 11A, at the second point in time t2, because a voltage of the sensing node SO corresponding to each of the first to fifth memory cells MC1 to MC5 is smaller than the sensing reference voltage SREF, the first to fifth memory cells MC1 to MC5 may be determined to be in the turn-on state ON. At the second point in time t2, because a voltage of the sensing node SO corresponding to the sixth memory cell MC6 is greater than the sensing reference voltage SREF, the sixth memory cell MC6 may be determined to be in the turn-off state OFF. A result of the second sensing operation may be temporarily stored in the sensing latch LAT_S described with reference to FIG. 10.

In an embodiment, a verified state of a memory cell may be determined through the first and second sensing operations described above. For example, the first to third memory cells MC1 to MC3 in which all the results of the first and second sensing operations indicate the turn-on state ON may be determined to be in a program progress state (i.e., as being not yet programmed to a target program state); the sixth memory cell MC6 in which all the results of the first and second sensing operations indicate the turn-off state OFF may be determined to be in a program-inhibit state (i.e., as being programmed to the target program state). The fourth and fifth memory cells MC4 and MC5 in which the results of the first and second sensing operations are different from each other may be determined to be in a forcing state (i.e., as being not programmed to the target program state but having a threshold voltage adjacent to the target threshold voltage).

As described above, the memory device 100 may perform the 2-step verify operation by performing the sensing operation two times at different timings in a state where one verify voltage is applied to the selected word line.

In an embodiment, the control of the 2-step verify range may be implemented by controlling timings of two sensing operations. For example, as illustrated in FIG. 11B, the memory device 100 may perform the first sensing operation at a third point in time t3 earlier than the first point in time t1 and may perform the second sensing operation at the second point in time t2 when a given time passes from the third point in time t3. The results of the first and second sensing operations associated with the first, second, fourth, fifth, and sixth memory cells MC1, MC2, MC4, MC5, and MC6 are the same as those described with reference to FIG. 11B, and thus, additional description will be omitted to avoid redundancy.

In the case where a time point of the first sensing operation is advanced from the first point in time t1 to the third point in time t3, a result of determining the third memory cell MC3 may change. For example, in the embodiment of FIG. 11A, in the case where the first sensing operation is performed at the first point in time t1, the third memory cell MC3 may be determined to be in the turn-on state ON; in the embodiment of FIG. 11B, in the case where the first sensing operation is performed at the third point in time t3 earlier than the first point in time t1, the third memory cell MC3 may be determined to be in the turn-off state OFF. That is, the same effect as a level of a verify voltage applied to a selected word line decreases may be obtained by advancing a time point of a sensing operation.

That is, the embodiment of FIG. 11B in which the third memory cell MC3 is determined to be in the forcing state may correspond to the embodiment of FIG. 9 in which the 2-step verify range associated with a specific program state is controlled.

The above configuration for controlling the 2-step verify range is only for describing embodiments of the present disclosure easily, and the present disclosure is not limited thereto. For example, while performing a specific program loop corresponding to a specific program state, the memory device 100 may together control the 2-step verify range corresponding to another program state, as well as the specific program state. For example, during a first program loop not corresponding to the specific program state, the memory device 100 may perform the 2-step verify operation based on a first 2-step verify range. During an n-th program loop corresponding to the specific program state, the memory device 100 may perform the 2-step verify operation based on a second 2-step verify range.

As described above, the memory device 100 according to an embodiment of the present disclosure may perform a specific program loop corresponding to a specific program state by using a changed program parameter(s). As such, a threshold voltage distribution of memory cells corresponding to the specific program state may be improved. Also, the memory device 100 may perform the remaining program loops not corresponding to the specific program state by using a normal program parameter different from the changed program parameter(s). As such, the reduction of performance of the program operation of the memory device 100 may be minimized.

In an embodiment, the program parameter may include a variety of information such as a program voltage increment, a 2-step verify range, and a bit line forcing voltage in each program loop. To describe embodiments of the present disclosure easily, in the above embodiments, the control of the program voltage increment, the control of the 2-step verify range, and the control of the bit line forcing voltage are described as independent embodiments, but the present disclosure is not limited thereto. For example, it may be understood that the above embodiments may be implemented independently of each other or two or more thereof may be combined.

Figure 12:
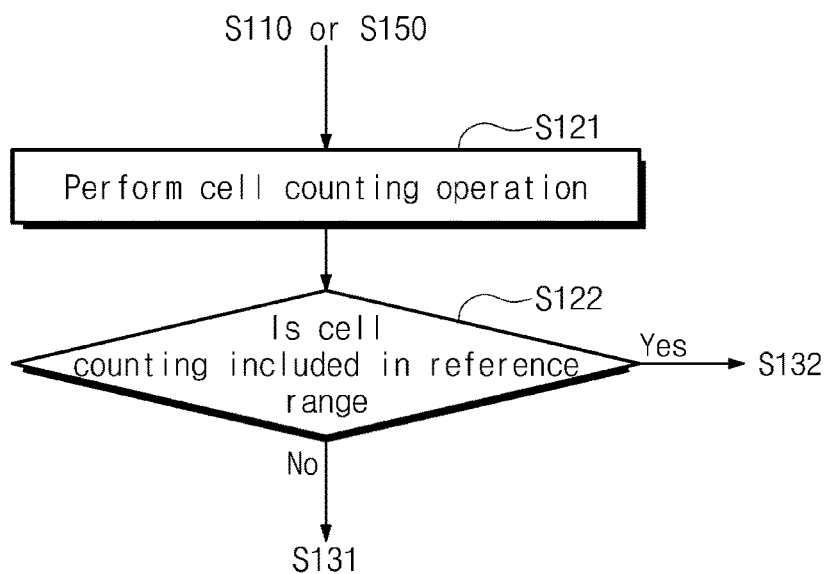
FIG. 12 is a flowchart for describing operation S120 of FIG. 5.
Figure 13:
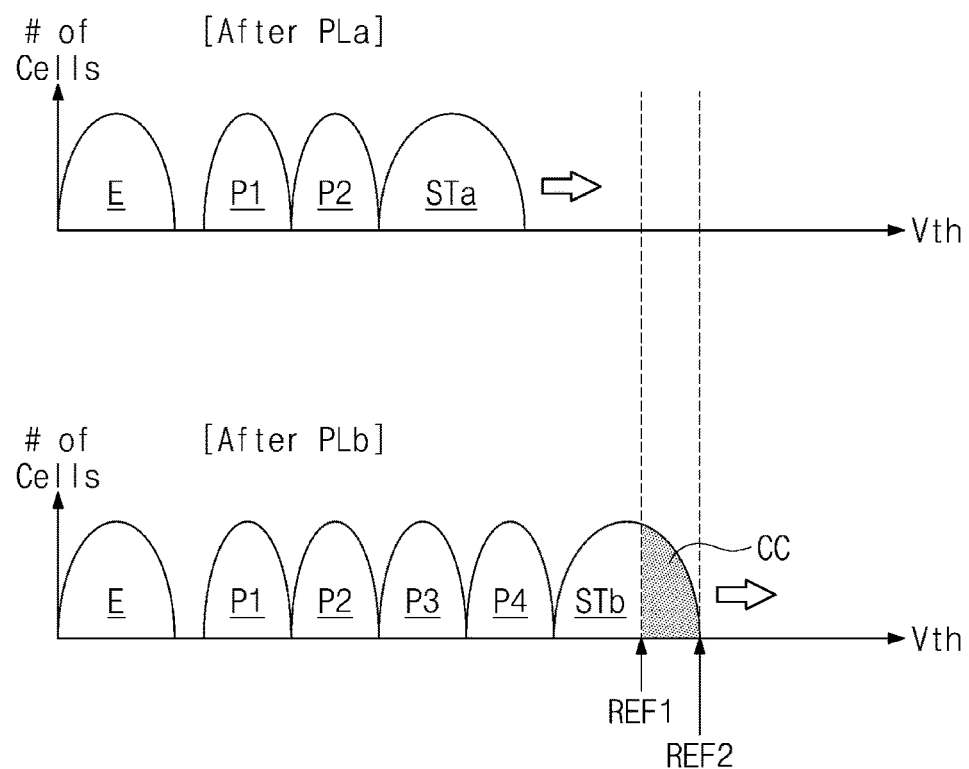
FIG. 13 is a diagram for describing an operation of FIG. 12.

FIG. 12 is a flowchart for describing operation S120 of FIG. 5. FIG. 13 is a diagram for describing an operation of FIG. 12. In an embodiment, operation S120 of FIG. 5 refers to an operation of determining whether a next program loop is a target program loop. The operation of determining whether a next program loop is a target program loop (i.e., a program loop corresponding to a specific program state) may be implemented through various schemes.

For example, the target program loop may be defined by an external device (e.g., a memory controller). In this case, the external device (e.g., a memory controller) may set information about the target program loop in the memory device 100 by using a set command such as a set feature command. In the case where a current program loop reaches to the target program loop thus set, the memory device 100 may control program parameters based on the methods described with reference to FIGS. 1 to 11B.

Alternatively, the memory device 100 may determine the target program loop based on a cell counting operation. For example, as illustrated in FIG. 12, after a current program loop is performed (i.e., after operation S110 or operation S150 of FIG. 5), in operation S121, the memory device 100 may perform the cell counting operation on a selected word line. In an embodiment, the cell counting operation may indicate an operation of counting the number of memory cells each having a threshold voltage greater than a reference voltage from among memory cells connected to the selected word line, the number of memory cells each having a threshold voltage smaller than the reference voltage from among the memory cells connected to the selected word line, or the number of memory cells each having a threshold voltage belonging to a specific range from among the memory cells connected to the selected word line.

In an embodiment, the cell counting operation may be performed by applying one reference voltage to the selected word line. Alternatively, as in the 2-step verify operation described above, the cell counting operation may be performed through sensing operations of different timings. In this case, the number of memory cells each having a threshold voltage belonging to the specific range may be counted.

In an embodiment, operation S121 may be performed separately from a program loop (i.e., a program step and a verify step). For example, operation S121 may be performed after a program loop is performed as much as the given number of times. Alternatively, operation S121 may be performed through a verify step of a current program loop.

In operation S122, the memory device 100 may determine whether a cell counting result is included in a reference range. When the cell counting result is not included in the reference range, the memory device 100 may perform operation S131 (i.e., may perform a program loop based on the first program parameter (or normal program parameter)). When the cell counting result is included in the reference range, the memory device 100 may perform operation S132 (i.e., may perform a program loop based on the second program parameter).

For example, as illustrated in FIG. 13, the reference range may refer to a range between a first reference voltage REF1 and a second reference voltage REF2. In an embodiment, the first reference voltage REF1 and the second reference voltage REF2 may be determined based on a lower limit of a specific program state (e.g., P6) and may be smaller than the lower limit of the specific program state (e.g., P6).

In the case where an a-th program loop PLa is performed, all memory cells corresponding to the erase state "E", the first program state P1, and the second program state P2 may be in a state of being completely programmed, and the remaining memory cells may be under program progress and may have an a-th state STa. In this case, a b-th state STb may not be included in the reference range.

After a b-th program loop PLb is performed, all memory cells corresponding to the erase state "E", the first program state P1, the second program state P2, the third program state P3, and the fourth program state P4 may be in a state of being completely programmed, and the remaining memory cells may be under program progress and may have the b-th state STb. Threshold voltages of some of the memory cells in the b-th state STb may be included in the reference range (i.e., a range from REF1 to REF2). This may mean that a verify operation or a substantial program operation is performed on memory cells corresponding to the specific program state P6 in a next program loop of the b-th program loop PLb. In this case, the substantial program operation for the memory cells corresponding to the specific program state P6 may refer to an operation in which the memory cells have threshold voltages corresponding to the specific program state P6 by applying a program voltage once.

For example, after the b-th program loop PLb, in the case where the number of memory cells each having a threshold voltage included in the reference range from REF1 to REF2 is greater than or equal to a reference value, a next program loop of the b-th program loop PLb may be a target program loop, and the memory device 100 may perform the target program loop based on the second program parameter (i.e., the changed program parameter).

Figure 14:
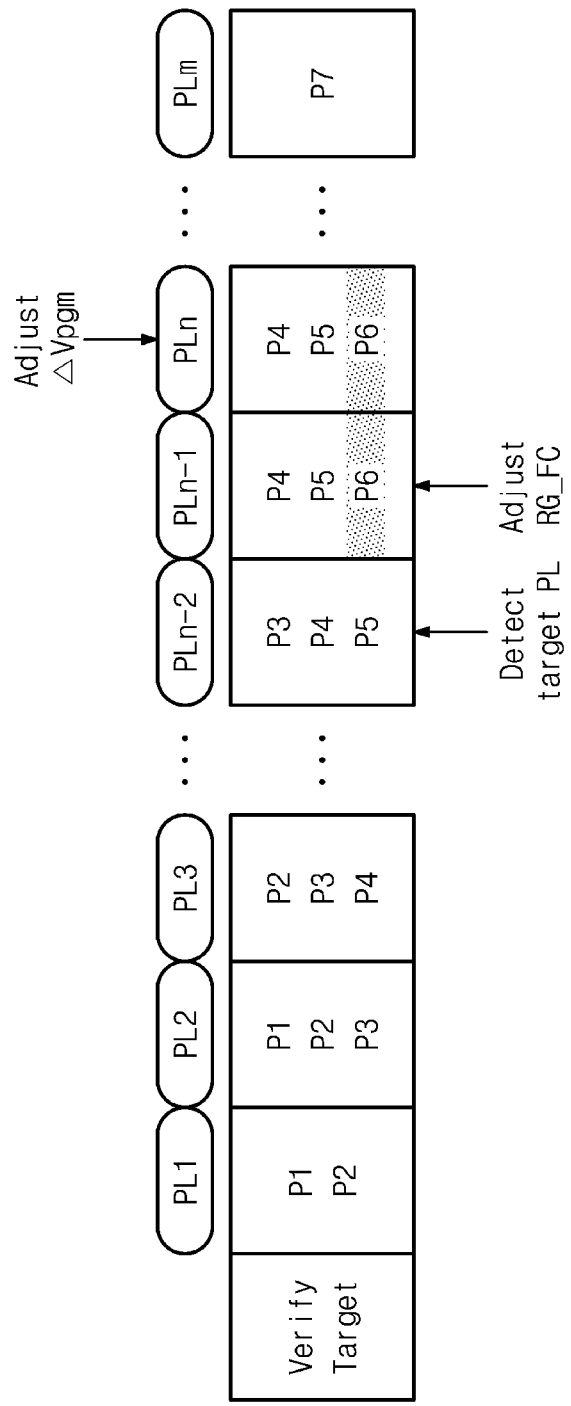
FIG. 14 is a diagram for describing a program operation of a memory device of FIG. 1.

FIG. 14 is a diagram for describing a program operation of a memory device of FIG. 1. For convenience of description, components that are described above are omitted. Referring to FIGS. 1 and 14, the memory device 100 may perform the plurality of program loops PL1 to PLm. As described with reference to FIG. 6, each of the plurality of program loops PL1 to PLm may include a program step of applying the program voltage Vpgm and a verify step of applying a verify voltage set.

In an embodiment, as described with reference to FIG. 4, in the case where a memory cell is a TLC, the memory cell may be programmed to have one of the erase state "E" and the first to seventh program states P1 to P7. In this case, the first to seventh verify voltages Vvfy1 to Vvfy7 may be used to verify the first to seventh program states P1 to P7. Because each memory cell is programmed from the erase state "E" to one of the first to seventh program states P1 to P7, there is no need to verify all the program states P1 to P7 in each of the plurality of program loops PL1 to PLm.

That is, only specific program states may be verified in each program loop. For example, the first and second program states P1 and P2 may be verified in the verify step of the first program loop PL1, and the first to third program states P1 to P3 may be verified in the verify step of the second program loop PL2. In the verify step of the second program loop PL2, memory cells corresponding to the first program state P1 may be determined as being completely programmed. In this case, in the third program loop PL3, the verify operation may not be performed on the first program state P1 and may be performed on the second to fourth program states P2 to P4.

Likewise, in the verify step of the (n–2)-th program loop PLn–2, the verify operation may be performed on the third to fifth program states P3 to P5. In the verify step of each of the (n–1)-th and n-th program loops PLn–1 and PLn, the verify operation may be performed on the fourth to sixth program states P4 to P6.

In this case, in the verify step of the (n–2)-th program loop PLn–2 or a next program loop, the next program loop may be detected as a target program loop. For example, the memory device 100 may determine that the next program loop (i.e., PLn–1) is the target program loop, based on a cell counting result, whether a current program loop is a given program loop, or whether a verify voltage associated with the target program loop is used.

In the (n–1)-th program loop PLn–1 being the target program loop, the memory device 100 may control the 2-step verify range RG_FC; in the n-th program loop PLn being a next program loop, the memory device 100 may control the program voltage increment Δ Vpgm. In an embodiment, in the n-th program loop PLn, the memory device 100 may control the program voltage increment ΔVpgm and the bit line forcing voltage VFC together. The way to control each program parameter is described above, and thus, additional description will be omitted to avoid redundancy.

Afterwards, the memory device 100 may perform the seventh program state P7 in the verify step of the m-th program loop PLm. In an embodiment, in the case where memory cells corresponding to the specific program state (e.g., P6) are completely programmed, the memory device 100 may again change the changed program parameter into the normal program parameter. That is, the program parameter (e.g., the program voltage increment, the 2-step verify range, or the bit line forcing voltage) used in the m-th program loop PLm may be the same as the program parameter used in the first to (n–2)-th program loops PL1 to PLn–2.

As described above, the memory device 100 may program memory cells by performing a plurality of program loops. In a program loop (i.e., PLn–2) that is ahead of the specific program loop (e.g., PLn) as much as two program loops, the memory device 100 may determine whether a next program loop (i.e., PLn–1) is a target program loop. In this case, the memory device 100 may control the 2-step verify range in the (n–1)-th program loop PLn–1 and may control the program voltage increment ΔVpgm and the bit line forcing voltage VFC in the (n–1)-th program loop PLn–1. In an embodiment, the number of program loops in which the 2-step verify range is controlled and the number of program loops in which the program voltage increment ΔVpgm and the bit line forcing voltage VFC are controlled may be variously changed depending on whether memory cells corresponding to the specific program state (e.g., P6) are completely programmed.

Figure 15:
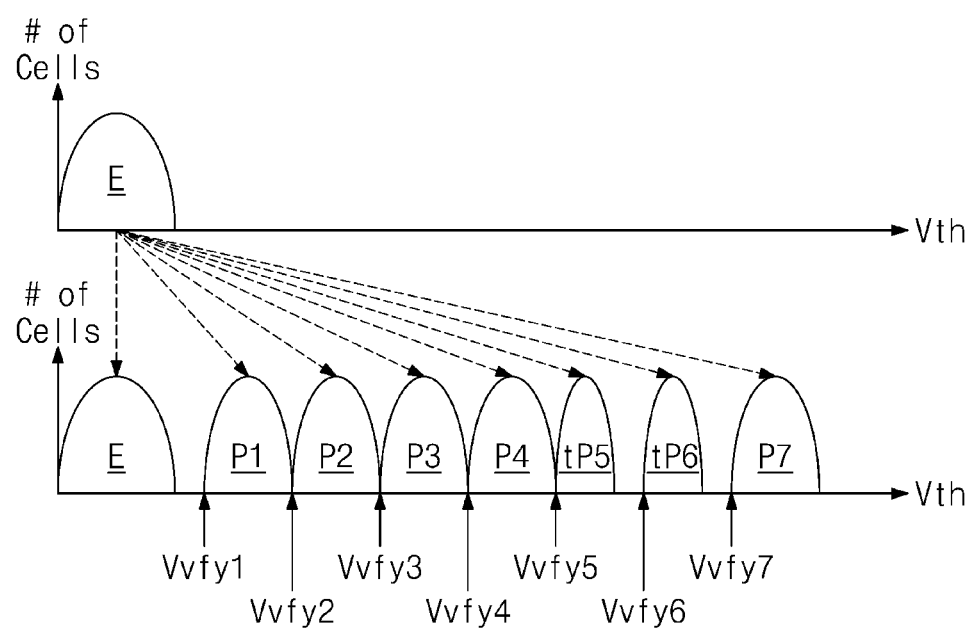
FIG. 15 is a distribution diagram for describing a program operation of a memory device of FIG. 1.

FIG. 15 is a distribution diagram for describing a program operation of a memory device of FIG. 1. In the above embodiments, the description is given as a specific program state for improving a threshold voltage distribution of memory cells is the sixth program state P6 (i.e., one program state). However, the present disclosure is not limited thereto.

Referring to FIGS. 1 and 15, the memory device 100 may program memory cells such that each memory cell has one of the erase state "E" and the first to seventh program states P1 to P7. Unlike the above embodiments, the memory device 100 may perform the program operation such that memory cells corresponding to the fifth and sixth program states P5 and P6 (i.e., two program states) have fifth and sixth target program states tP5 and tP6. The embodiment of FIG. 15 are similar to the above embodiments except that the number of specific program states is "2", and thus, additional description will be omitted to avoid redundancy.

As described above, according to embodiments of the present disclosure, the memory device 100 may perform the program operation such that threshold voltages of memory cells corresponding to two or more program state are improved.

Figure 16:
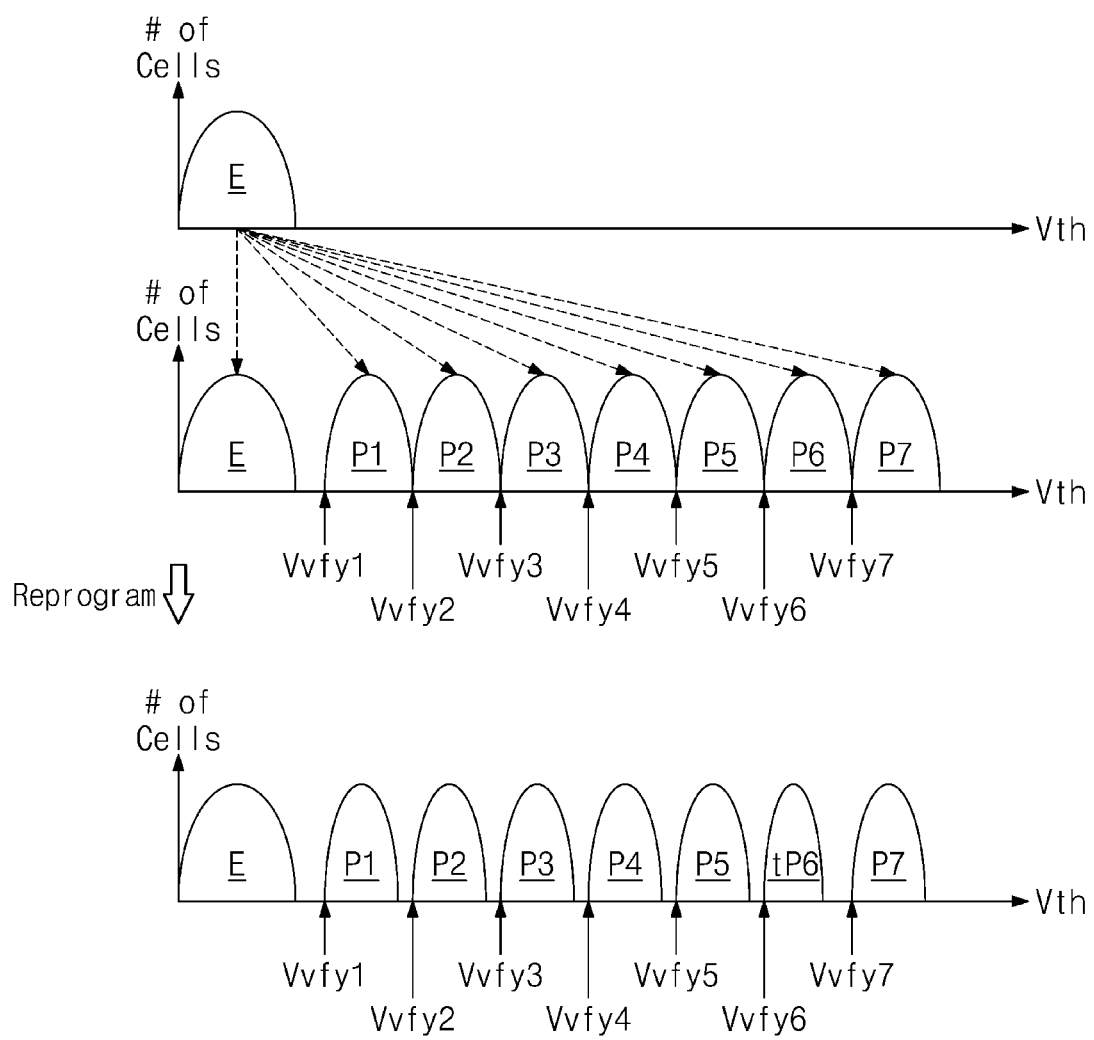
FIG. 16 is a distribution diagram for describing a program operation of a memory device of FIG. 1.

FIG. 16 is a distribution diagram for describing a program operation of a memory device of FIG. 1. Referring to FIGS. 1 and 16, the memory device 100 may program memory cells such that each memory cell has one of the erase state "E" and the first to seventh program states P1 to P7. Afterwards, without an erase operation, the memory device 100 may perform a reprogram operation on the memory cells having the erase state "E" and first to seventh program states P1 to P7. In this case, the memory device 100 may program memory cells corresponding to a specific program state (e.g., the sixth program state P6) so as to form a threshold voltage distribution narrower than that of memory cells of another program state. That is, in the reprogram operation, the memory device 100 may use the changed program parameter in a program loop corresponding to the sixth program state P6. In this case, memory cells corresponding to the sixth program state P6 may be programmed to have the sixth target program state tP6. The embodiment of FIG. 16 is similar to the above embodiments except that the embodiments of the present disclosure are applied to the reprogram operation, and thus, additional description will be omitted to avoid redundancy.

Figure 17:
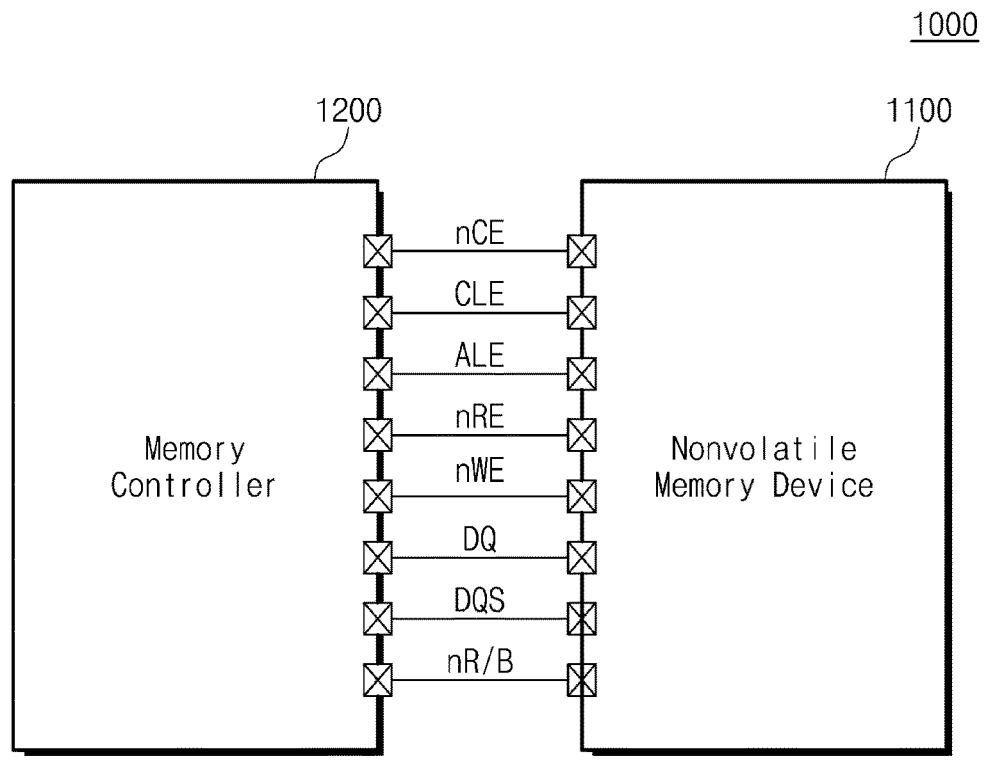
FIG. 17 is a block diagram illustrating a memory system 1000 according to an embodiment of the present disclosure.

FIG. 17 is a block diagram illustrating a memory system 1000 according to an embodiment of the present disclosure. Referring to FIG. 17, a memory system 1000 may include a memory device 1100 and a memory controller 1200. The memory system 1000 may be a storage device, which is configured to store user data in a computing system, such as a solid state drive (SSD). In an embodiment, the memory device 1100 may be the memory device described with reference to FIGS. 1 to 16 or may operate based on the operation method described with reference to FIGS. 1 to 16.

The memory controller 1200 may store data in the memory device 1100 or may read data stored in the memory device 1100. For example, the memory controller 1200 may send various signals (e.g., nCE, CLE, ALE, nRE, nWE, and nR/B) to the memory device 1100 and may exchange data signals (e.g., DQ and DQS) with the memory device 1100. In detail, the memory device 1100 may receive a chip enable signal nCE from the memory controller 1200. When the chip enable signal nCE is in an enable state (e.g., at a low level), the memory device 1100 may exchange signals with the memory controller 1200.

The memory controller 1200 may send the chip enable signal nCE to the memory device 1100. The memory controller 1200 may exchange signals with the memory device 1100 through the chip enable signal nCE.

The memory controller 1200 may send the data signal DQ including the command CMD or the address ADDR to the memory device 1100 together with a write enable signal nWE toggling. The memory controller 1200 may send the data signal DQ including the command CMD to the memory device 1100 by sending a command latch enable signal CLE of an enable state and may send the data signal DQ including the address ADDR to the memory device 1100 by sending an address latch enable signal ALE of an enable state.

The memory controller 1200 may send a read enable signal nRE to the memory device 1100. The memory controller 1200 may receive the data strobe signal DQS from the memory device 1100 or may send the data strobe signal DQS to the memory device 1100.

The memory controller 1200 may generate the read enable signal nRE and may send the read enable signal nRE to the memory device 1100, and the memory device 1100 may output the data "DATA" in response to the read enable signal nRE. For example, the memory controller 1200 may generate the read enable signal nRE that switches from a stationary state (e.g., a high level or a low level) to a toggling state before the data "DATA" are output. As such, the memory device 1100 may generate the data strobe signal DQS based on the read enable signal nRE. The memory controller 1200 may receive the data signal DQ including the data "DATA" from the memory device 1100 together with the data strobe signal DQS. The memory controller 1200 may obtain the data "DATA" from the data signal DQ based on the toggle timing of the data strobe signal DQS.

The memory controller 1200 may generate the data strobe signal DQS, and the memory device 1100 may receive the data "DATA" in response to the data strobe signal DQS. For example, the memory controller 1200 may generate the data strobe signal DQS that switches from a stationary state (e.g., a high level or a low level) to a toggling state before sending the data "DATA". The memory controller 1200 may send the data signal DQ including the data "DATA" in synchronization with the toggle timing of the data strobe signal DQS.

The memory controller 1200 may receive a ready/busy signal nR/B from the memory device 1100. The memory controller 1200 may determine the status information of the memory device 1100 based on the ready/busy signal nR/B.

In an embodiment, the memory controller 1200 may control an overall operation of the memory device 1100. For example, the memory controller 1200 may allow the memory device 1100 to perform the program operation described with reference to FIGS. 1 to 16.

In an embodiment, the program parameter described with reference to FIGS. 1 to 16 may be controlled or set by the memory controller 1200. For example, the memory controller 1200 may set various program parameters of the memory device 1100 through the set feature command, and the memory device 1100 may perform the program operation described with reference to FIGS. 1 to 16 by using the program parameters thus set.

Figure 18:
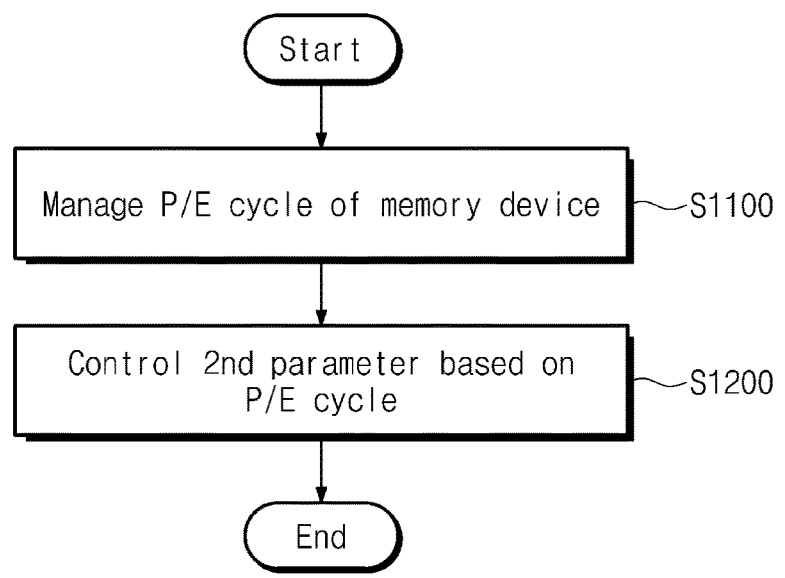
FIG. 18 is a flowchart illustrating an operation of a memory controller of FIG. 17.

FIG. 18 is a flowchart illustrating an operation of a memory controller of FIG. 17. Referring to FIGS. 17 and 18, in operation S1100, the memory controller 1200 may manage program/erase (P/E) cycles of the memory device 1100. For example, the memory controller 1200 may manage the P/E cycles of each of a plurality of memory blocks included in the memory device 1100.

In operation S1200, the memory controller 1200 may control the second program parameter based on the P/E cycles. For example, as the number of P/E cycles of a memory block increases, an operating speed of memory cells in the memory block may become higher. That the operating speed of memory cells becomes higher means that a change in threshold voltages of the memory cells become greater under the same bias program condition. For example, as the number of P/E cycles of a memory block increases, a threshold voltage distribution of memory cells in the memory block may become wider; in this case, the additional control of the program parameter may be required to improve a threshold voltage distribution of memory cells corresponding to a specific program state. As the number of P/E cycles increases, in a specific program loop corresponding to the specific program state, the memory controller 1200 may further decrease a program voltage increment in a specific program loop, may make the 2-step verify range wider, or may further decrease the bit line forcing voltage.

Figure 19:
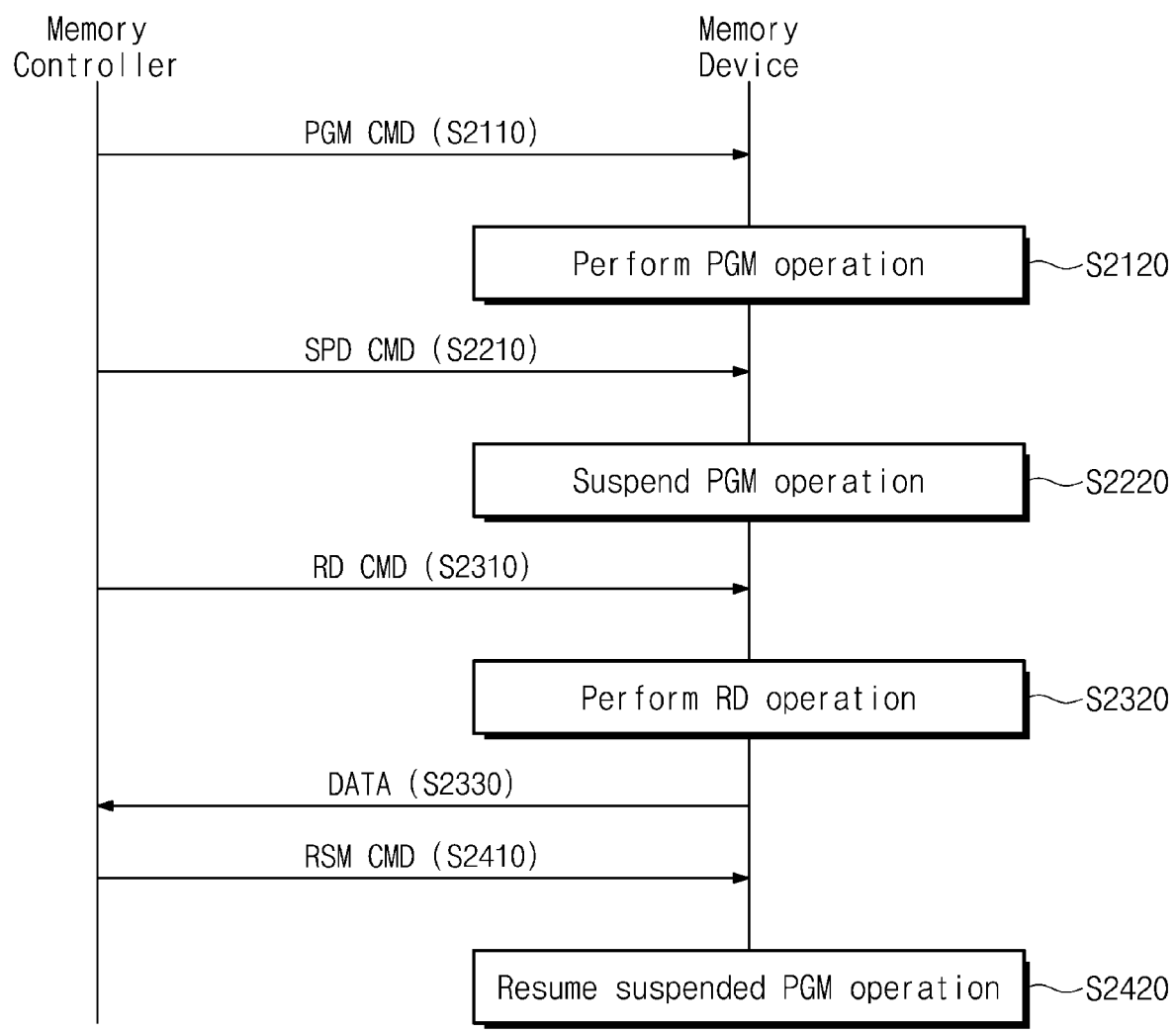
FIG. 19 is a flowchart illustrating an operation of a memory system of FIG. 17.
Figures 20, 21:
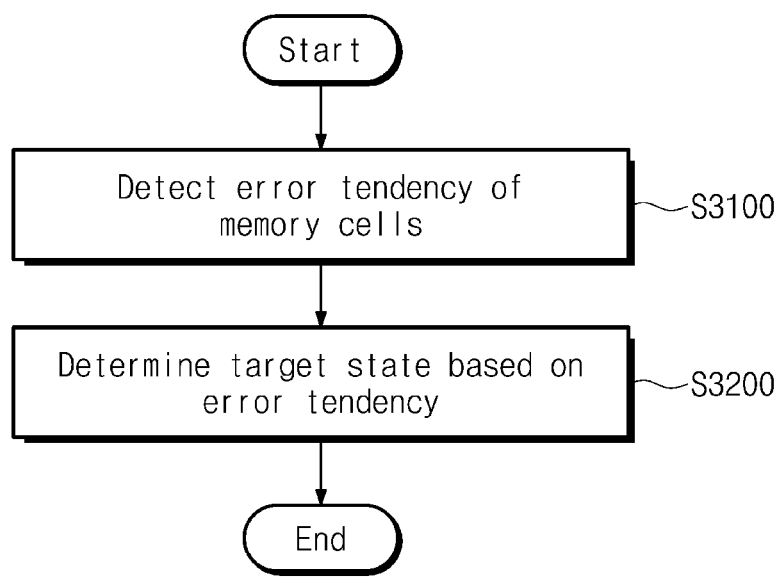
FIG. 20 is a diagram for describing operation S2420 of FIG. 19.
FIG. 21 is a flowchart illustrating an operation of a memory controller of FIG. 17.

FIG. 19 is a flowchart illustrating an operation of a memory system of FIG. 17. FIG. 20 is a diagram for describing operation S2420 of FIG. 19. Referring to FIGS. 17, 19, and 20, in operation S2110, the memory controller 1200 may send a program command PGM CMD to the memory device 1100. In operation S2120, the memory device 1100 may perform the program operation in response to the program command PGM CMD. In an embodiment, the program operation may be performed based on the operation described with reference to FIGS. 1 to 16.

In operation S2210, the memory controller 1200 may send a suspend command SPD CMD to the memory device 1100. For example, while the memory device 1100 performs the program operation, the memory controller 1200 may require a read operation of the memory device 1100. In this case, the memory controller 1200 may send, to the memory device 1100, the suspend command SPD CMD for suspending the program operation being performed in the memory device 1100.

In operation S2220, the memory device 1100 may suspend the program operation being performed in response to the suspend command SPD CMD. In an embodiment, suspend information about the program operation being performed (e.g., information about data not yet programmed, or information about a verify result) may be stored in some latches of a page buffer circuit included in the memory device 1100 or may be stored in any other storage circuit.

In operation S2310, the memory controller 1200 may send a read command RD CMD to the memory device 1100. In operation S2320, the memory device 1100 may perform the read operation in response to the read command RD CMD. In operation S2330, the memory device 1100 may send the read data to the memory controller 1200.

In operation S2410, the memory controller 1200 may send a resume command RSM CMD for resuming the suspended program operation to the memory device 1100. In operation S2420, the memory device 1100 may perform the suspended program operation in response to the resume command RSM CMD.

In an embodiment, the program operation (i.e., the program operation in operation S2120) before the suspend command SPD is received may be performed based on the first and second program parameters as described with reference to FIGS. 1 to 16. In an embodiment, the resumed program operation (i.e., the program operation in operation S2420) after the resume command RSM CMD is received may be performed based on third and fourth program parameters different from the first and second program parameters.

For example, as illustrated in FIG. 20, in the normal program operation according to an embodiment of the present disclosure, program loops that do not correspond to the specific program state may be performed based on the first program parameters (e.g., Δ Vpgm1, VFC1, and RG_FC1), and program loops that correspond to the specific program state may be performed based on the second program parameters (e.g., ΔVpgm2, VFC2, and RG_FC2). In contrast, in the resumed program operation according to an embodiment of the present disclosure, program loops that do not correspond to the specific program state may be performed based on the third program parameters (e.g., ΔVpgm3, VFC3, and RG_FC3), and program loops that correspond to the specific program state may be performed based on the fourth program parameters (e.g., α Vpgm4, VFC4, and RG_FC4).

In this case, as described above, according to an embodiment of the present disclosure, the first program parameters (e.g., ΔVpgm1, VFC1, and RG_FC1) may be different from the second program parameters (e.g., ΔVpgm2, VFC2, and RG_FC2), and the third program parameters (e.g., ΔVpgm3, VFC3, and RG_FC3) may be different from the fourth program parameters (e.g., ΔVpgm4, VFC4, and RG_FC4). In addition, program parameters before the program operation is suspended may be different from program parameters after the program operation is suspended. That is, the first program parameters (e.g., ΔVpgm1, VFC1, and RG_FC1) may be different from the third program parameters (e.g., ΔVpgm3, VFC3, and RG_FC3), and the second program parameters (e.g., ΔVpgm2, VFC2, and RG_FC2) may be different from the fourth program parameters (e.g., ΔVpgm4, VFC4, and RG_FC4).

Figure 22:
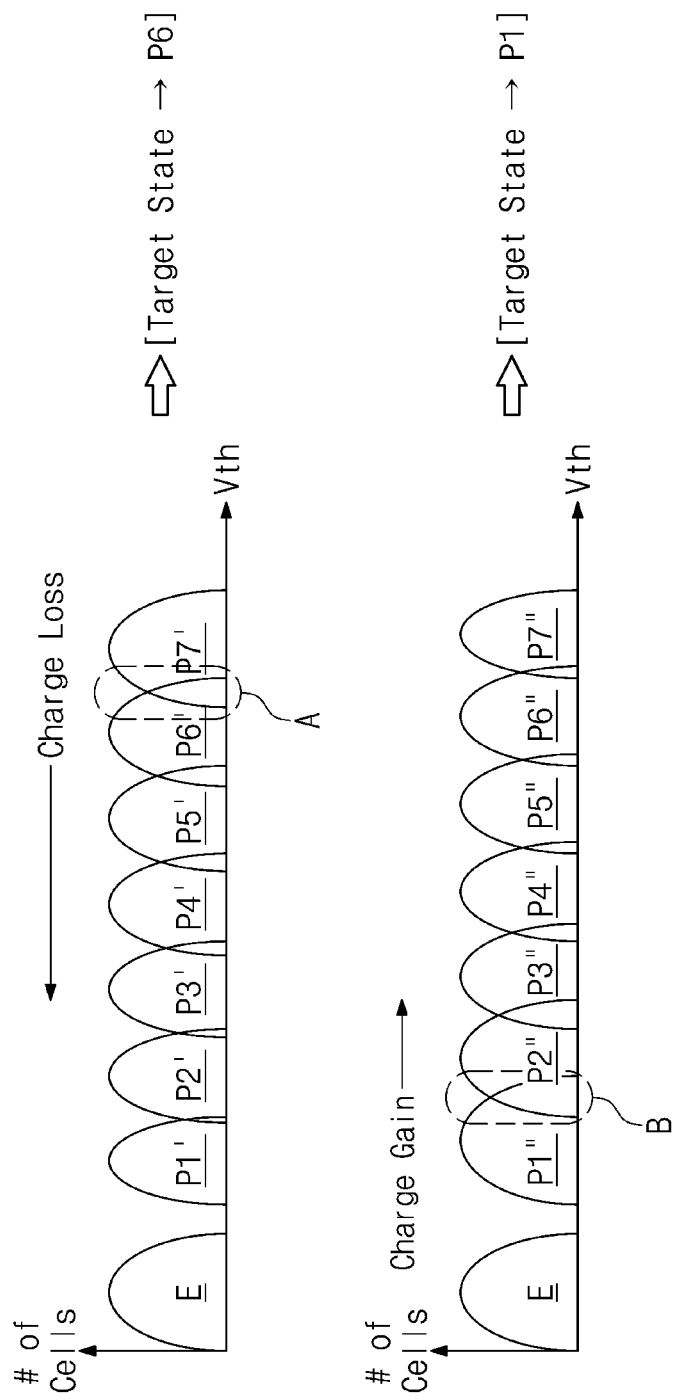
FIG. 22 is a diagram for describing an operation of FIG. 21.

FIG. 21 is a flowchart illustrating an operation of a memory controller of FIG. 17. FIG. 22 is a diagram for describing an operation of FIG. 21. Referring to FIGS. 17 and 21, in operation S3100, the memory controller 1200 may detect an error tendency of memory cells included in the memory device 1100. For example, as illustrated in FIG. 22, threshold voltages of programmed memory cells may change due to various factors. As an example, as a time passes from a point in time when memory cells are programmed, the charge loss may occur in the memory cells; in this case, threshold voltages of the memory cells may decrease. That is, the threshold voltages of the memory cells may overall decrease like program states P1' to P7' of FIG. 22. In an embodiment, the change in the threshold voltage due to the charge loss may greatly occur at a relatively high program state (e.g., the seventh program state P7). In this case, a plurality of errors may occur in region "A" of FIG. 22.

Alternatively, the hot electron injection (HCI) may occur due to a potential difference of a local channel or the coupling of any other word line, or the charge gain may occur at memory cells due to the read disturb or the program disturb. In this case, threshold voltages of the memory cells increase. That is, the threshold voltages of the memory cells may overall increase like program states P1" to P7" of FIG. 22. In an embodiment, the change in the threshold voltage due to the charge gain may greatly occur at a relatively low program state (e.g., the first program state P1). In this case, a plurality of errors may occur in region "B" of FIG. 22.

As described above, a location of an error occurring in memory cells or a threshold voltage change tendency may change depending on various factors. The memory controller 1200 may determine the error tendency of memory cells (i.e., whether the charge loss or the charge gain occurs), based on a result of performing, at the memory device 1100, the cell counting operation or the read operation. For example, in the case of performing an off-cell counting operation on memory cells by using a voltage corresponding to region "A" of FIG. 22, the number of counted off-cells may be relatively small compared to a result of counting normal memory cells. In this case, the memory controller 1200 may determine that the error tendency of memory cells corresponds to the charge loss. Alternatively, in the case of performing an on-cell counting operation on memory cells by using a voltage corresponding to region "B" of FIG. 22, the number of counted on-cells may be relatively small compared to a result of counting normal memory cells. In this case, the memory controller 1200 may determine that the error tendency of memory cells corresponds to the charge gain. The above error tendency detecting method of the memory controller 1200 is only an example, and the present disclosure is not limited thereto.

In operation S3200, the memory controller 1200 may determine a target program state (or a specific program state) based on the error tendency. For example, a region in which a plurality of errors occur may be determined based on the error tendency detected in operation S3100. In the case where the error tendency corresponds to the charge loss, as illustrated in FIG. 22, a plurality of error occurs in region "A". In this case, the memory controller 1200 may determine the sixth program state P6 as a target program state. That is, a threshold voltage distribution of memory cells corresponding to the sixth program state P6 may be improved through the program operation according to an embodiment of the present disclosure, and thus, the frequency of error occurrence in region "A" may decrease.

Alternatively, in the case where the error tendency corresponds to the charge gain, as illustrated in FIG. 22, a plurality of error occurs in region "B". In this case, the memory controller 1200 may determine the first program state P1 as a target program state. That is, a threshold voltage distribution of memory cells corresponding to the first program state P1 may be improved, and thus, the frequency of error occurrence in region "B" may decrease.

In an embodiment, information about the determined target program state may be set to the memory device 1100. The above configuration for determining the target program state is only an example, and the present disclosure is not limited thereto.

Figure 23:
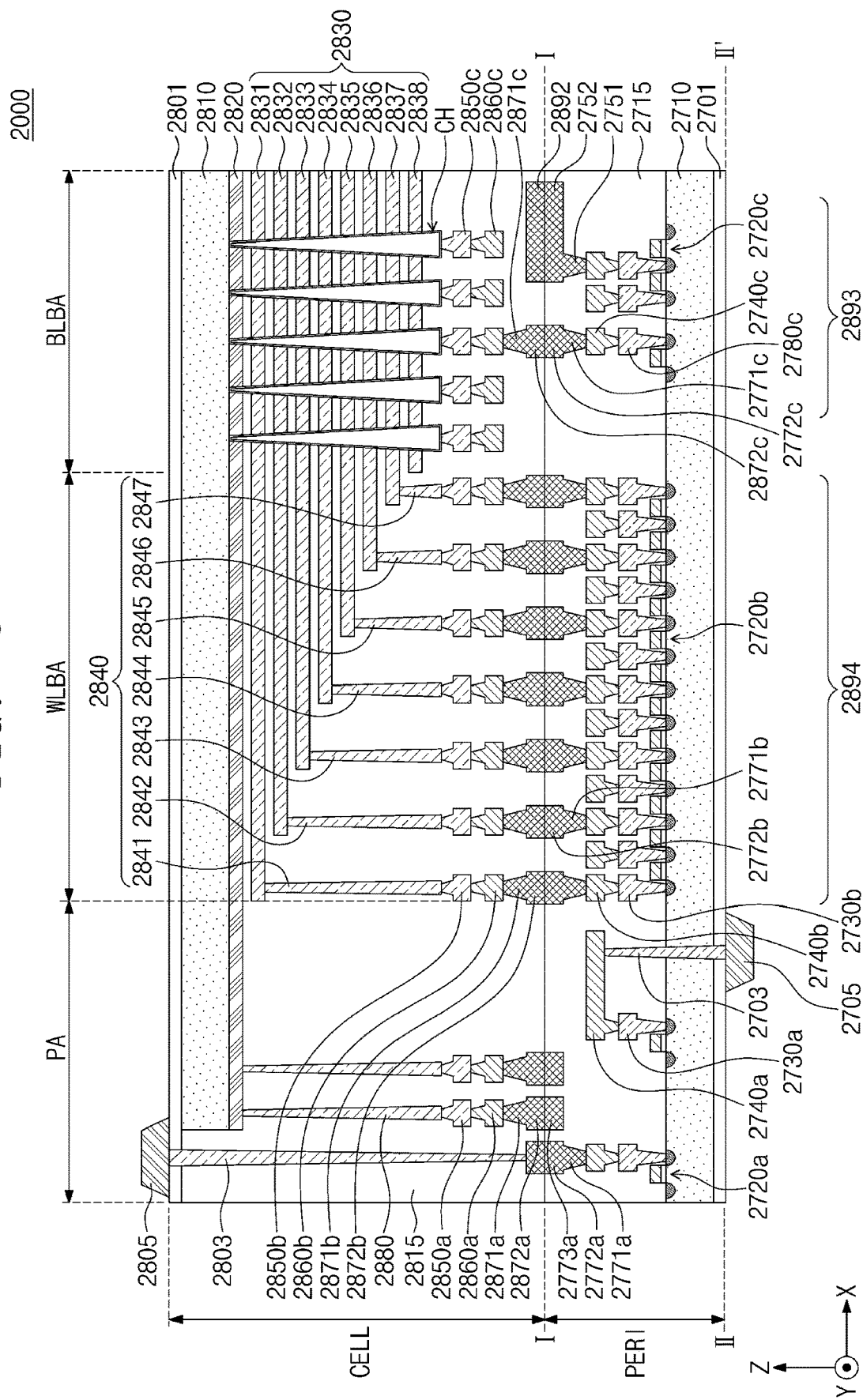
FIG. 23 is a cross-sectional view illustrating a memory device according to an embodiment of the present disclosure.

FIG. 23 is a diagram illustrating a memory device 2000 according to another example embodiment.

Referring to FIG. 23, a memory device 2000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a word line bonding area WLBA, and a bit line bonding area BLBA.

The peripheral circuit region PERI may include a first substrate 2710, an interlayer insulating layer 2715, a plurality of circuit elements 2720*a*. 2720*b*, and 2720*c* formed on the first substrate 2710, first metal layers 2730*a*, 2730*b*, and 2730*c* respectively connected to the plurality of circuit elements 2720*a*. 2720*b*, and 2720*c*, and second metal layers 2740*a*, 2740*b*, and 2740*c* formed on the first metal layers 2730*a*, 2730*b*, and 2730*c*. In an example embodiment, the first metal layers 2730*a*, 2730*b*, and 2730*c* may be formed of tungsten having relatively high electrical resistivity, and the second metal layers 2740*a*, 2740*b*, and 2740*c* may be formed of copper having relatively low electrical resistivity.

Although only the first metal layers 2730*a*, 2730*b*, and 2730*c* and the second metal layers 2740*a*, 2740*b*, and 2740*c* are shown and described, the example embodiment is not limited thereto, and one or more additional metal layers may be further formed on the second metal layers 2740*a*, 2740*b*, and 2740*c*. At least a portion of the one or more additional metal layers formed on the second metal layers 2740*a*, 2740*b*, and 2740*c* may be formed of aluminum or the like having a lower electrical resistivity than those of copper forming the second metal layers 2740*a*, 2740*b*, and 2740*c*.

The interlayer insulating layer 2715 may be disposed on the first substrate 2710 and cover the plurality of circuit elements 2720*a*. 2720*b*, and 2720*c*, the first metal layers 2730*a*, 2730*b*, and 2730*c*, and the second metal layers 2740*a*, 2740*b*, and 2740*c*. The interlayer insulating layer 2715 may include an insulating material such as silicon oxide, silicon nitride, or the like.

Lower bonding metals 2771*b* and 2772*b* may be formed on the second metal layer 2740*b* in the word line bonding area WLBA. In the word line bonding area WLBA, the lower bonding metals 271*b* and 2772*b* in the peripheral circuit region PERI may be electrically bonded to upper bonding metals 2871*b* and 2872*b* of the cell region CELL. The lower bonding metals 2771*b* and 2772*b* and the upper bonding metals 2871*b* and 2872*b* may be formed of aluminum, copper, tungsten, or the like. Further, the upper bonding metals 2871*b* and 2872*b* in the cell region CELL may be referred to as first metal pads and the lower bonding metals 2771*b* and 2772*b* in the peripheral circuit region PERI may be referred to as second metal pads.

The cell region CELL may include at least one memory block. The cell region CELL may include a second substrate 2810 and a common source line 2820. On the second substrate 2810, a plurality of word lines 2831 to 2838 (i.e., 2830) may be stacked in a direction (a Z-axis direction), perpendicular to an upper surface of the second substrate 2810. At least one string select line and at least one ground select line may be arranged on and below the plurality of word lines 2830, respectively, and the plurality of word lines 2830 may be disposed between the at least one string select line and the at least one ground select line.

In the bit line bonding area BLBA, a channel structure CH may extend in a direction (a Z-axis direction), perpendicular to the upper surface of the second substrate 2810, and pass through the plurality of word lines 2830, the at least one string select line, and the at least one ground select line. The channel structure CH may include a data storage layer, a channel layer, a buried insulating layer, and the like, and the channel layer may be electrically connected to a first metal layer 2850*c* and a second metal layer 2860*c*. For example, the first metal layer 2850*c* may be a bit line contact, and the second metal layer 2860*c* may be a bit line. In an example embodiment, the bit line 2860*c* may extend in a first direction (a Y-axis direction), parallel to the upper surface of the second substrate 2810.

An area in which the channel structure CH, the bit line 2860*c*, and the like are disposed may be defined as the bit line bonding area BLBA. In the bit line bonding area BLBA, the bit line 2860*c* may be electrically connected to the circuit elements 2720*c* providing a page buffer 2893 in the peripheral circuit region PERI. The bit line 2860*c* may be connected to upper bonding metals 2871*c* and 2872*c* in the cell region CELL, and the upper bonding metals 2871*c* and 2872*c* may be connected to lower bonding metals 2771*c* and 2772*c* connected to the circuit elements 2720*c* of the page buffer 2893. In an example embodiment, a program operation may be executed based on a page unit as write data of the page-unit is stored in the page buffer 2893, and a read operation may be executed based on a sub-page unit as read data of the sub-page unit is stored in the page buffer 2893. Also, in the program operation and the read operation, units of data transmitted through bit lines may be different from each other.

In the word line bonding area WLBA, the plurality of word lines 2830 may extend in a second direction (an X-axis direction), parallel to the upper surface of the second substrate 2810 and perpendicular to the first direction, and may be connected to a plurality of cell contact plugs 2841 to 2847 (i.e., 2840). The plurality of word lines 2830 and the plurality of cell contact plugs 2840 may be connected to each other in pads provided by at least a portion of the plurality of word lines 2830 extending in different lengths in the second direction. A first metal layer 2850*b* and a second metal layer 2860*b* may be connected to an upper portion of the plurality of cell contact plugs 2840 connected to the plurality of word lines 2830, sequentially. The plurality of cell contact plugs 2840 may be connected to the peripheral circuit region PERI by the upper bonding metals 2871*b* and 2872*b* of the cell region CELL and the lower bonding metals 2771*b* and 2772*b* of the peripheral circuit region PERI in the word line bonding area WLBA.

The plurality of cell contact plugs 2840 may be electrically connected to the circuit elements 2720*b* forming a row decoder 2894 in the peripheral circuit region PERI. In an example embodiment, operating voltages of the circuit elements 2720*b* of the row decoder 2894 may be different than operating voltages of the circuit elements 2720*c* forming the page buffer 2893. For example, operating voltages of the circuit elements 2720*c* forming the page buffer 2893 may be greater than operating voltages of the circuit elements 2720*b* forming the row decoder 2894.

A common source line contact plug 2880 may be disposed in the external pad bonding area PA. The common source line contact plug 2880 may be formed of a conductive material such as a metal, a metal compound, polysilicon, or the like, and may be electrically connected to the common source line 2820. A first metal layer 2850*a* and a second metal layer 2860*a* may be stacked on an upper portion of the common source line contact plug 2880, sequentially. For example, an area in which the common source line contact plug 2880, the first metal layer 2850*a*, and the second metal layer 2860*a* are disposed may be defined as the external pad bonding area PA.

Input-output pads 2705 and 2805 may be disposed in the external pad bonding area PA. A lower insulating film 2701 covering a lower surface of the first substrate 2710 may be formed below the first substrate 2710, and a first input-output pad 2705 may be formed on the lower insulating film 2701. The first input-output pad 2705 may be connected to at least one of the plurality of circuit elements 2720*a*, 2720*b*, and 2720*c* disposed in the peripheral circuit region PERI through a first input-output contact plug 2703, and may be separated from the first substrate 2710 by the lower insulating film 2701. In addition, a side insulating film may be disposed between the first input-output contact plug 2703 and the first substrate 2710 to electrically separate the first input-output contact plug 2703 and the first substrate 2710.

An upper insulating film 2801 covering the upper surface of the second substrate 2810 may be formed on the second substrate 2810, and a second input-output pad 2805 may be disposed on the upper insulating layer 2801. The second input-output pad 2805 may be connected to at least one of the plurality of circuit elements 2720*a*, 2720*b*, and 2720*c* disposed in the peripheral circuit region PERI through a second input-output contact plug 2803. In the example embodiment, the second input-output pad 2805 is electrically connected to a circuit element 2720*a*.

According to embodiments, the second substrate 2810 and the common source line 2820 may not be disposed in an area in which the second input-output contact plug 2803 is disposed. Also, the second input-output pad 2805 may not overlap the word lines 2830 in the third direction (the Z-axis direction). The second input-output contact plug 2803 may be separated from the second substrate 2810 in a direction, parallel to the upper surface of the second substrate 2810, and may pass through the interlayer insulating layer 2815 of the cell region CELL to be connected to the second input-output pad 2805.

According to embodiments, the first input-output pad 2705 and the second input-output pad 2805 may be selectively formed. For example, the memory device 2000 may include only the first input-output pad 2705 disposed on the first substrate 2710 or the second input-output pad 2805 disposed on the second substrate 2810. Alternatively, the memory device 2000 may include both the first input-output pad 2705 and the second input-output pad 2805.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2000 may include a lower metal pattern 2773*a*, corresponding to an upper metal pattern 2872*a* formed in an uppermost metal layer of the cell region CELL, and having the same cross-sectional shape as the upper metal pattern 2872*a* of the cell region CELL so as to be connected to each other, in an uppermost metal layer of the peripheral circuit region PERI. In the peripheral circuit region PERI, the lower metal pattern 2773*a* formed in the uppermost metal layer of the peripheral circuit region PERI may not be connected to a contact. Similarly, in the external pad bonding area PA, an upper metal pattern 2872*a*, corresponding to the lower metal pattern 2773*a* formed in an uppermost metal layer of the peripheral circuit region PERI, and having the same shape as a lower metal pattern 2773*a* of the peripheral circuit region PERI, may be formed in an uppermost metal layer of the cell region CELL.

The lower bonding metals 2771*b* and 2772*b* may be formed on the second metal layer 2740*b* in the word line bonding area WLBA. In the word line bonding area WLBA, the lower bonding metals 2771*b* and 2772*b* of the peripheral circuit region PERI may be electrically connected to the upper bonding metals 2871*b* and 2872*b* of the cell region CELL by a Cu-to-Cu bonding.

Further, in the bit line bonding area BLBA, an upper metal pattern 2892, corresponding to a lower metal pattern 2752 formed in the uppermost metal layer of the peripheral circuit region PERI, and having the same cross-sectional shape as the lower metal pattern 2752 of the peripheral circuit region PERI, may be formed in an uppermost metal layer of the cell region CELL. A contact may not be formed on the upper metal pattern 2892 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

In an embodiment, the memory device 2000 may be the memory device 100 described with reference to FIGS. 1 to 16 or may operate based on the operation method described with reference to FIGS. 1 to 16.

Figure 24:
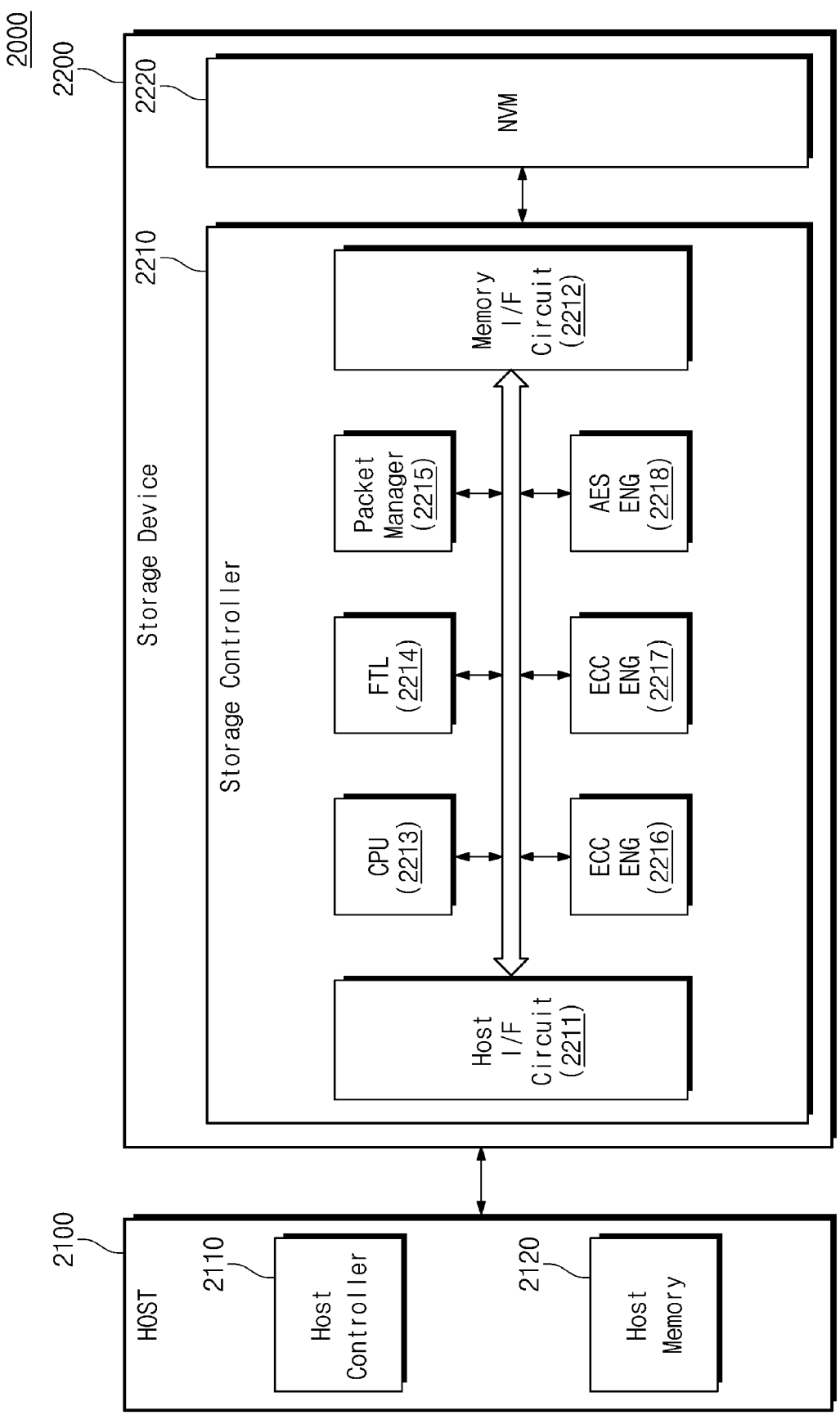
FIG. 24 is a block diagram illustrating a host-storage system according to an embodiment of the present disclosure.

FIG. 24 is a block diagram of a host storage system 2000 according to an example embodiment.

The host storage system 2000 may include a host 2100 and a storage device 2200. Further, the storage device 2200 may include a storage controller 2210 and an NVM 2220. According to an example embodiment, the host 2100 may include a host controller 2110 and a host memory 2120. The host memory 2120 may serve as a buffer memory configured to temporarily store data to be transmitted to the storage device 2200 or data received from the storage device 2200.

The storage device 2200 may include storage media configured to store data in response to requests from the host 2100. As an example, the storage device 2200 may include at least one of an SSD, an embedded memory, and a removable external memory. When the storage device 2200 is an SSD, the storage device 2200 may be a device that conforms to an NVMe standard. When the storage device 2200 is an embedded memory or an external memory, the storage device 2200 may be a device that conforms to a UFS standard or an eMMC standard. Each of the host 2100 and the storage device 2200 may generate a packet according to an adopted standard protocol and transmit the packet.

When the NVM 2220 of the storage device 2200 includes a flash memory, the flash memory may include a 2D NAND memory array or a 3D (or vertical) NAND (VNAND) memory array. As another example, the storage device 2200 may include various other kinds of NVMs. For example, the storage device 2200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 2110 and the host memory 2120 may be implemented as separate semiconductor chips. Alternatively, in some embodiments, the host controller 2110 and the host memory 2120 may be integrated in the same semiconductor chip. As an example, the host controller 2110 may be any one of a plurality of modules included in an application processor (AP). The AP may be implemented as a System on Chip (SoC). Further, the host memory 2120 may be an embedded memory included in the AP or an NVM or memory module located outside the AP.

The host controller 2110 may manage an operation of storing data (e.g., write data) of a buffer region of the host memory 2120 in the NVM 2220 or an operation of storing data (e.g., read data) of the NVM 2220 in the buffer region.

The storage controller 2210 may include a host interface 2211, a memory interface 2212, and a CPU 2213. Further, the storage controllers 2210 may further include a flash translation layer (FTL) 2214, a packet manager 2215, a buffer memory 2216, an error correction code (ECC) engine 2217, and an advanced encryption standard (AES) engine 2218. The storage controllers 2210 may further include a working memory (not shown) in which the FTL 2214 is loaded. The CPU 2213 may execute the FTL 2214 to control data write and read operations on the NVM 2220.

The host interface 2211 may transmit and receive packets to and from the host 2100. A packet transmitted from the host 2100 to the host interface 2211 may include a command or data to be written to the NVM 2220. A packet transmitted from the host interface 2211 to the host 2100 may include a response to the command or data read from the NVM 2220. The memory interface 2212 may transmit data to be written to the NVM 2220 to the NVM 2220 or receive data read from the NVM 2220. The memory interface 2212 may be configured to comply with a standard protocol, such as Toggle or open NAND flash interface (ONFI).

The FTL 2214 may perform various functions, such as an address mapping operation, a wear-leveling operation, and a garbage collection operation. The address mapping operation may be an operation of converting a logical address received from the host 2100 into a physical address used to actually store data in the NVM 2220. The wear-leveling operation may be a technique for preventing excessive deterioration of a specific block by allowing blocks of the NVM 2220 to be uniformly used. As an example, the wear-leveling operation may be implemented using a firmware technique that balances erase counts of physical blocks. The garbage collection operation may be a technique for ensuring usable capacity in the NVM 2220 by erasing an existing block after copying valid data of the existing block to a new block.

The packet manager 2215 may generate a packet according to a protocol of an interface, which consents to the host 22100, or parse various types of information from the packet received from the host 22100. In addition, the buffer memory 2216 may temporarily store data to be written to the NVM 2220 or data to be read from the NVM 2220. Although the buffer memory 2216 may be a component included in the storage controllers 2210, the buffer memory 2216 may be outside the storage controllers 2210.

The ECC engine 2217 may perform error detection and correction operations on read data read from the NVM 2220. More specifically, the ECC engine 2217 may generate parity bits for write data to be written to the NVM 2220, and the generated parity bits may be stored in the NVM 2220 together with write data. During the reading of data from the NVM 2220, the ECC engine 2217 may correct an error in the read data by using the parity bits read from the NVM 2220 along with the read data, and output error-corrected read data.

The AES engine 2218 may perform at least one of an encryption operation and a decryption operation on data input to the storage controllers 2210 by using a symmetric-key algorithm.

In an embodiment, the storage controller 2210 may be the memory controller 1200 described with reference to FIGS. 17 to 22 or may operate based on the operation method described with reference to FIGS. 17 to 22. In an embodiment, the nonvolatile memory (NVM) 2220 may be the memory device 100 described with reference to FIGS. 1 to 16 or may operate based on the operation method described with reference to FIGS. 1 to 16.

According to the present disclosure, a threshold voltage distribution of memory cells corresponding to a specific program state may be improved. In this case, even though threshold voltages of memory cells vary due to various factors, an error of data stored in the memory cells may be prevented or decreased. Accordingly, a memory cells with improved reliability and an operating method thereof may be provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An operation method of a memory device that includes a plurality of memory cells stacked in a direction perpendicular to a substrate, the method comprising:
   performing first to (n−1)-th program loops on selected memory cells connected to a selected word line from among the plurality of memory cells, based on a first program parameter; and
   after the (n−1)-th program loop is performed, performing n-th to k-th program loops on the selected memory cells, based on a second program parameter different from the first program parameter,
   wherein n is an integer greater than 1 and k is an integer greater than or equal to n, and
   wherein the first and second program parameters include information about at least two of a program voltage increment, a 2-step verify range, and a bit line forcing voltage used in the first to k-th program loops.

2. The method of claim 1, further comprising:
   after the k-th program loop is performed, performing (k+1)-th to m-th program loops based on the first program parameter,
   wherein m is an integer greater than k.

3. The method of claim 1, wherein a subset of the memory cells of the selected memory cells form a threshold voltage distribution corresponding to a specific program state through the n-th to k-th program loops.

4. The method of claim 3, wherein, in each of the n-th to k-th program loops, the subset of the memory cells of the selected memory cells are verified by using a verify voltage for verifying the specific program state.

5. The method of claim 1, wherein a second program voltage increment belonging to the second program parameter used in the n-th to k-th program loops is smaller than a first program voltage increment belonging to the first program parameter used in the first to (n−1)-th program loops.

6. The method of claim 5, wherein a second bit line forcing voltage belonging to the second program parameter used in the n-th to k-th program loops is smaller than a first bit line forcing voltage belonging to the first program parameter used in the first to (n−1)-th program loops.

7. The method of claim 6, wherein a decreasing ratio of the second program voltage increment to the first program voltage increment is equal to a decreasing ratio of the second bit line forcing voltage to the first bit line forcing voltage.

8. The method of claim 5, wherein a second 2-step verify range belonging to the second program parameter used in the n-th to k-th program loops is greater than a first 2-step verify range belonging to the first program parameter used in the first to (n−1)-th program loops.

9. The method of claim 1, further comprising:
after the n-th program loop is performed, performing a cell counting operation on the selected memory cells connected to the selected word line from among the plurality of memory cells.

10. The method of claim 9, wherein a result of the cell counting operation indicates the number of memory cells each having a threshold voltage between a first reference voltage and a second reference voltage from among the selected memory cells, and
wherein, when the result of the cell counting operation is greater than or equal to a reference value, the n-th program loop is performed based on the second program parameter.

11. The method of claim 1, wherein the n-th to k-th program loops are set by an external memory controller.

12. A program method of a memory device that includes a plurality of memory cells stacked in a direction perpendicular to a substrate, the method comprising:
performing a first program step on selected memory cells connected to a selected word line from among the plurality of memory cells by applying a first program voltage to the selected word line;
performing a first verify step on the selected memory cells by applying a first verify voltage set to the selected word line;
performing a second program step on the selected memory cells by applying a second program voltage to the selected word line and applying a program-inhibit voltage, a ground voltage, and a first bit line forcing voltage to bit lines corresponding to the selected memory cells, based on a result of the first verify step;
performing a second verify step on the selected memory cells by applying a second verify voltage set to the selected word line; and
performing a third program step on the selected memory cells by applying a third program voltage to the selected word line and applying the program-inhibit voltage, the ground voltage, and a second bit line forcing voltage to the bit lines corresponding to the selected memory cells, based on a result of the second verify step,
wherein a difference between the first and second program voltages is a first program voltage increment, a difference between the second and third program voltages is a second program voltage increment different from the first program voltage increment, and the first bit line forcing voltage is different from the second bit line forcing voltage.

13. The method of claim 12, wherein the second program voltage increment is smaller than the first program voltage increment, and the second bit line forcing voltage is smaller than the first bit line forcing voltage.

14. The method of claim 13, wherein a decreasing ratio of the second program voltage increment to the first program voltage increment is equal to a decreasing ratio of the second bit line forcing voltage to the first bit line forcing voltage.

15. The method of claim 12, wherein the first verify step is performed based on a first 2-step verify range, and the second verify step is performed based on a second 2-step verify range greater than the first 2-step verify range.

16. An operation method of a memory system which includes a memory device and a memory controller configured to control the memory device, the method comprising:
sending, by the memory controller, a program command to the memory device; and
performing, by the memory device, a program operation in response to the program command,
wherein the program operation includes:
performing first to (n−1)-th program loops on selected memory cells connected to a selected word line from among a plurality of memory cells included in the memory device, based on a first program parameter; and
after the (n−1)-th program loop is performed, performing n-th to k-th program loops on the selected memory cells, based on a second program parameter different from the first program parameter,
wherein n is an integer greater than 1 and k is an integer greater than or equal to n, and
wherein the first and second program parameters include information about at least two of a program voltage increment, a 2-step verify range, and a bit line forcing voltage used in the first to k-th program loops.

17. The method of claim 16, further comprising:
managing, by the memory controller, program/erase cycles of the memory device; and
controlling, by the memory controller, the first and second program parameters based on the program/erase cycles.

18. The method of claim 16, further comprising:
sending, by the memory controller, a suspend command to the memory device while the memory device performs the program operation;
suspending, by the memory device, the program operation being performed;
sending, by the memory controller, a resume command to the memory device; and
resuming, by the memory device, the suspended program operation.

19. The method of claim 18, wherein the memory device changes the first program parameter into a third program parameter and changes the second program parameter into a fourth program parameter, and
wherein the memory device resumes the suspended program operation based on the third program parameter and the fourth program parameter.

20. The method of claim 16, wherein memory cells corresponding to a specific program state from among the selected memory cells are programmed through the n-th to k-th program loops, and
wherein the specific program state is determined by the memory controller.

* * * * *